(12) United States Patent
Kim

(10) Patent No.: US 12,444,370 B2
(45) Date of Patent: Oct. 14, 2025

(54) DISPLAY DEVICE

(71) Applicant: Samsung Display Co., Ltd., Yongin-Si (KR)

(72) Inventor: Keun Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/506,134

(22) Filed: Nov. 10, 2023

(65) Prior Publication Data
US 2024/0339081 A1    Oct. 10, 2024

(30) Foreign Application Priority Data

Apr. 7, 2023  (KR) .................. 10-2023-0045846

(51) Int. Cl.
G09G 3/3266   (2016.01)
H10K 59/121   (2023.01)
H10K 50/18    (2023.01)

(52) U.S. Cl.
CPC ....... *G09G 3/3266* (2013.01); *H10K 59/1213* (2023.02); *G09G 2300/0426* (2013.01); *G09G 2300/0439* (2013.01); *H10K 50/18* (2023.02)

(58) Field of Classification Search
CPC .. H10K 59/1213; H10K 50/18; G09G 3/3266; G09G 2300/0439; G09G 2300/0426
See application file for complete search history.

(56) References Cited

U.S. PATENT DOCUMENTS

| | | |
|---|---|---|
| 8,462,097 B2 | 6/2013 | Kim et al. |
| 10,482,817 B2 | 11/2019 | Kim et al. |
| 10,902,778 B2 | 1/2021 | Kim et al. |
| 11,348,522 B2 | 5/2022 | Kim et al. |

(Continued)

FOREIGN PATENT DOCUMENTS

| | | |
|---|---|---|
| CN | 108154846 B | 4/2022 |
| KR | 10-2010-0076279 A | 7/2010 |

(Continued)

OTHER PUBLICATIONS

Keunwoo Kim, Jerry G. Fossum, Double-Gate CMOS: Symmetrical-Versus Asymmetrical-Gate Devices, IEEE Transactions on Electron Devices, vol. 48, No. 2, Feb. 2001.

(Continued)

*Primary Examiner* — Shaheda A Abdin
(74) *Attorney, Agent, or Firm* — Innovation Counsel LLP

(57) ABSTRACT

A display device offering a stabilized output of a small gate driving circuit is presented. The display device includes a substrate having a display area and a non-display area; a pixel disposed in the display area of the substrate; and a gate driving circuit disposed in the non-display area of the substrate and connected to a transistor of the pixel, wherein the gate driving circuit comprises: a node control unit; a pull-up transistor connected to a set node of the node control unit through a gate electrode; and a pull-down transistor connected to a reset node of the node control unit through a gate electrode, wherein a width of a first channel region of the pull-up transistor is greater than a width of a second channel region of the pull-down transistor.

20 Claims, 13 Drawing Sheets

(56) References Cited

U.S. PATENT DOCUMENTS

| | | | | |
|---|---|---|---|---|
| 2008/0017885 A1* | 1/2008 | Ishii | ................... | H10D 86/441 |
| | | | | 257/E27.113 |
| 2008/0231560 A1* | 9/2008 | Yamashita | ........... | G09G 3/3233 |
| | | | | 345/76 |
| 2012/0121061 A1* | 5/2012 | Sakamoto | ................ | G09G 3/20 |
| | | | | 377/64 |
| 2012/0241747 A1* | 9/2012 | Yamasaki | ......... | H01L 29/41733 |
| | | | | 257/E29.273 |
| 2015/0269879 A1* | 9/2015 | Shang | ..................... | G09G 3/20 |
| | | | | 345/215 |
| 2016/0064424 A1* | 3/2016 | Umezaki | .............. | G09G 3/3677 |
| | | | | 257/43 |
| 2016/0358573 A1* | 12/2016 | Takeuchi | ................ | G11C 19/28 |
| 2020/0058242 A1* | 2/2020 | Liu | .................... | H01L 27/1214 |
| 2021/0193764 A1* | 6/2021 | Cho | ................... | H01L 27/1225 |
| 2022/0044639 A1* | 2/2022 | Bai | ...................... | G09G 3/3266 |
| 2022/0375535 A1* | 11/2022 | Otose | ..................... | G09G 3/20 |

FOREIGN PATENT DOCUMENTS

| | | | | |
|---|---|---|---|---|
| KR | 10-2018-0064619 A | 6/2018 | | |
| WO | WO-2020182000 A1 * | 9/2020 | ........... | G09G 3/3266 |

OTHER PUBLICATIONS

Hyung-Kyu Lim, Jerry G. Fossum, Threshold Voltage of Thin-Film Silicon-on-Insulator (Sol) MOSFET's IEEE Tratisactions on Electron Devices, vol. ED-30, No. 10, Oct. 1983.

* cited by examiner

DISPLAY DEVICE

CROSS-REFERENCE TO RELATED APPLICATION

This application claims priority from Korean Patent Application No. 10-2023-0045846 filed on Apr. 7, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device, and more particularly, to a display device in which an output of a gate driving circuit is stabilized and a size of the gate driving circuit is decreased.

2. Description of the Related Art

A thin film transistor (TFT) has been used in various fields. In particular, it has been used as a switching and driving element in flat display devices such as liquid crystal displays (LCD), organic light emitting diode (OLED) displays, and electrophoretic displays.

SUMMARY

Aspects of the present disclosure provide a display device in which an output of a gate driving circuit is stabilized and a size of the gate driving circuit is decreased.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

In one aspect, the disclosure pertains to a display device including: a substrate having a display area and a non-display area; a pixel disposed in the display area of the substrate; and a gate driving circuit disposed in the non-display area of the substrate and connected to a transistor of the pixel, wherein the gate driving circuit comprises: a node control unit; a pull-up transistor connected to a set node of the node control unit through a gate electrode; and a pull-down transistor connected to a reset node of the node control unit through a gate electrode, wherein a width of a first channel region of the pull-up transistor is greater than a width of a second channel region of the pull-down transistor.

The display device may further include an active layer comprising the first channel region and the second channel region.

The active layer may include: a stem portion; a first branch portion extending from an upper edge of the stem portion along a first direction; a second branch portion extending from a center of the stem portion along the first direction; a third branch portion extending from a lower edge of the stem portion along the first direction; a first finger portion extending between the first branch portion and the second branch portion and comprising the first channel region; and a second finger portion extending between the second branch portion and the third branch portion and comprising the second channel region.

In an embodiment, more than one of the first finger portion may be provided between the first branch portion and the second branch portion.

the display device may include a first connection portion exposed between the first finger portions adjacent to each other.

In an embodiment, more than one of the second finger portion may be provided between the second branch portion and the third branch portion.

the display device may include a second connection portion extending between the second finger portions adjacent to each other.

The display device may further include a first gate pattern overlapping the first finger portion.

In an embodiment, the first gate pattern may include a first gate electrode of the pull-up transistor.

The first channel region may be defined by an overlapping of the first gate electrode and the first finger portion.

In an embodiment, the display device may include a first light blocking layer (BML1) overlapping the first finger portion and the first gate electrode.

The first light blocking layer may include a first counter gate electrode overlapping the first gate electrode.

The first gate electrode and the first counter gate electrode may be connected through a contact hole in an insulating layer.

the display device may include a second gate pattern overlapping the second finger portion.

In an embodiment, the second gate pattern may include a second gate electrode of the pull-down transistor.

In an embodiment, the second channel region may be defined by an overlapping of the second gate electrode and the second finger portion.

In an embodiment, the display device may include a second light blocking layer overlapping the second finger portion and the second gate electrode.

In an embodiment, the second light blocking layer may further include a second counter gate electrode overlapping the second gate electrode.

In an embodiment, a gate low voltage line may be connected to the second counter gate electrode through a contact hole in an insulating layer.

In an embodiment, the number of the second finger portions may be greater than the number of the first finger portions.

According to the display device of the present disclosure, the output of a driver can be stabilized and the size of the driver can be reduced.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
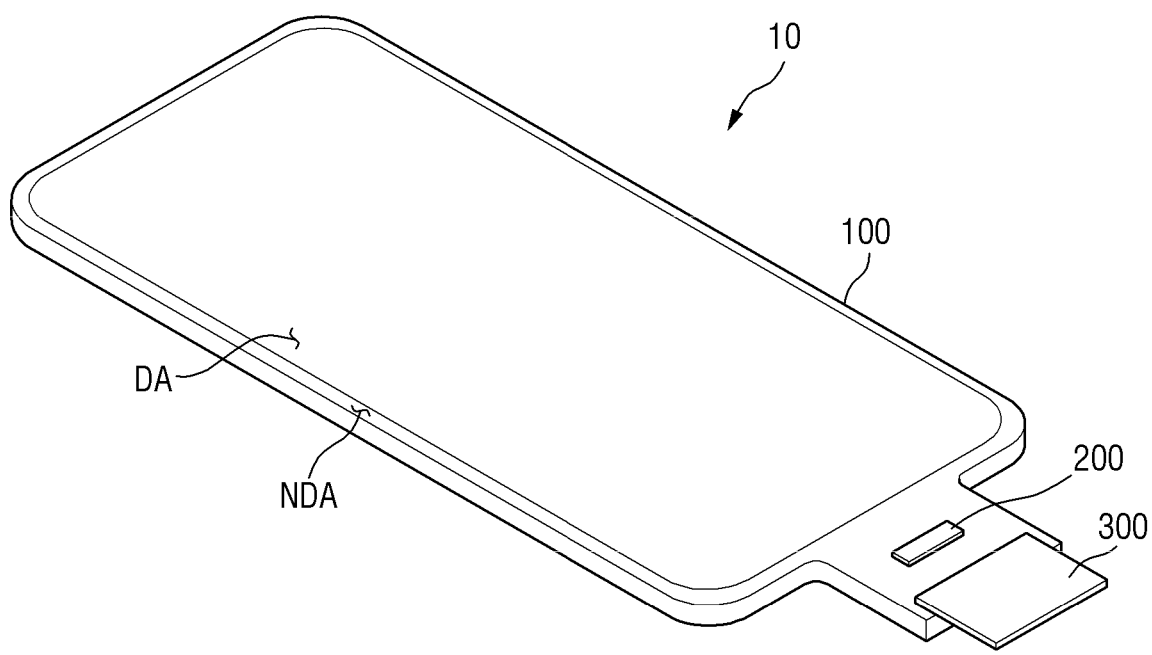
FIG. 1 is a perspective view of a display device according to one embodiment.
Figure 1:
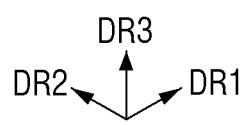

Advantages and features of the present disclosure and methods of achieving the same will become apparent with reference to the exemplary embodiments described below in detail in conjunction with the accompanying drawings. However, the present disclosure is not limited to exemplary embodiments described below, and may be implemented in different forms. Exemplary embodiments will be provided to make the present disclosure thorough and allow one of ordinary skill in the art to which the present disclosure pertains to recognize the scope of the present disclosure, and the present disclosure will be defined by the scope of the claims.

When an element or layer is referred to as being "on" another element or layer, it includes both a case in which the element or layer is directly on another element or layer and a case in which the element or layer is on another element or layer with the other element or layer interposed therebetween. The same reference numbers indicate the same components throughout the specification. Shapes, sizes, proportions, angles, numbers, and the like, disclosed in the drawings for describing exemplary embodiments are examples, and thus, the present disclosure is not limited to those illustrated in the drawings.

It will be understood that, although the terms "first", "second", and the like may be used to describe various components, these components should not be limited by these terms. These terms are only used to distinguish one component from another component. Accordingly, a first component discussed below could be termed a second component without departing from the teachings of the present disclosure.

Each feature of the various exemplary embodiments of the present disclosure may be partially or entirely coupled or combined with each other, and is technically capable of various interlocking and driving, and each exemplary embodiment may be implemented independently of each other or may be implemented in combination.

In the specification, "A and/or B" represents the case of A, B, or A and B. In addition, in the specification, "at least one of A and B" represents the case of A, B, or A and B.

Hereinafter, embodiments will be described in detail with reference to the accompanying drawings.

FIG. 1 is a perspective view of a display device according to one embodiment.

The terms "upper," "top" and "top surface" as used herein refer to an upward direction (i.e., a third direction DR3) with respect to a display panel. The terms "lower," "bottom" and "bottom surface" as used herein refer to a downward direction (i.e., a direction opposite to the third direction DR3) with respect to the display panel. Further, "left", "right", "upper" and "lower" refer to directions when the display device 10 is viewed from above. For example, "left" refers to an opposite direction of a first direction DR1, "right" refers to the first direction DR1, "upper" refers to a second direction DR2, and "lower" refers to an opposite direction of the second direction DR2.

The display device 10 displays an image on a screen through a display area DA, and various devices including the display area DA may be included therein. Examples of the display device 10 may include, but are not limited to, a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including the display area DA, an Internet-of-Things device, and the like.

In addition, the display device 10 may be a light emitting display device such as an organic light emitting display device using an organic light emitting diode, a quantum dot display device including a quantum dot light emitting layer, an inorganic light emitting display device including an inorganic semiconductor, and a micro light emitting display device using a micro light emitting diode. Hereinafter, an organic light emitting display device will be described as an example of the display device, and the organic light emitting display device applied to the embodiment will be simply referred to as the display device 10 unless special distinction is required. However, the embodiment is not limited to the organic light emitting display device, and other display devices mentioned above or known in the art may be applied within the same scope of technical spirit.

The display device 10 may include a display panel 100, a display driving circuit 200, and a circuit board 300.

The display panel 100 may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a curvature or may be right-angled. The planar shape of the display panel 100 is not limited to the rectangular shape, and may be formed in another polygonal shape, a circular shape or an elliptical shape. The display panel 100 may be formed to be flat, but embodiments are not limited thereto, and for example, may include a curved portion formed at left and right ends and having a constant curvature or a varying curvature. Alternatively, the display panel 100 may be formed flexibly so that it can be curved, bent, folded, or rolled.

The display panel 100 may be divided into a display area DA displaying an image or video and a non-display area NDA disposed around the display area DA, in plan view.

The display area DA may include a plurality of pixels. The pixel is a basic unit for displaying a screen. The pixels may include, but are not limited to, a red pixel, a green pixel, and a blue pixel. The pixels may further include a white pixel.

The plurality of pixels may be alternately arranged in plan view. For example, the pixels may be arranged in a matrix, but the present disclosure is not limited thereto.

The non-display area NDA may be disposed around the display area DA. A black matrix may be disposed in the non-display area NDA to prevent light emitted from adjacent pixels from leaking out. In addition, the non-display area NDA may include a driver for controlling or driving a plurality of pixels and a plurality of lines for applying an electric signal to each of the plurality of pixels. This will be described later in conjunction with FIGS. 2 and 3.

The non-display area NDA may surround the display area DA as illustrated in FIG. 1. That is, the display area DA may be formed in a quadrilateral shape, and the non-display area NDA may be disposed around four sides of the display area DA. However, the present disclosure is not limited thereto, and the display area DA may be partially surrounded by the non-display area NDA. For example, the non-display area NDA may be disposed only around three sides of the display area DA. In this case, the fourth side of the display area DA may form an edge of the display device 10.

The display driving circuit 200 may be formed as an integrated circuit (IC) attached onto the display panel by a chip on glass (COG) method, a chip on plastic (COP) method, or an ultrasonic bonding method, but the present disclosure is not limited thereto. For example, the display driving circuit 200 may be attached on the circuit board 300.

The circuit board 300 may be attached onto the pads DP using an anisotropic conductive film. Accordingly, lead lines of the circuit board 300 may be electrically disposed on the pads DP. The circuit board 300 may be a flexible printed circuit board, a printed circuit board, or a flexible film such as a chip on film.

Figure 2:
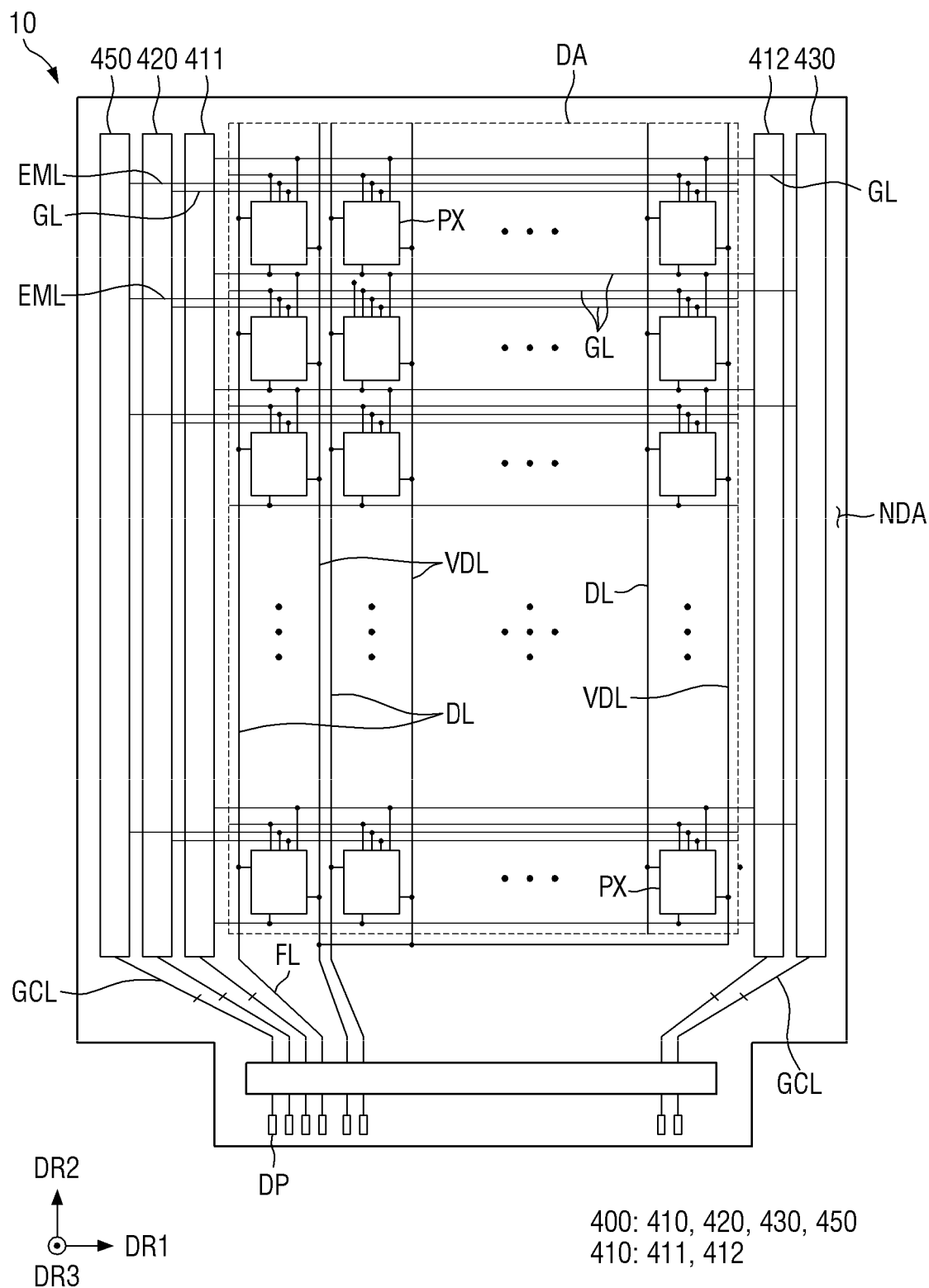
FIG. 2 is a plan view of a display device according to one embodiment.
Figure 3:
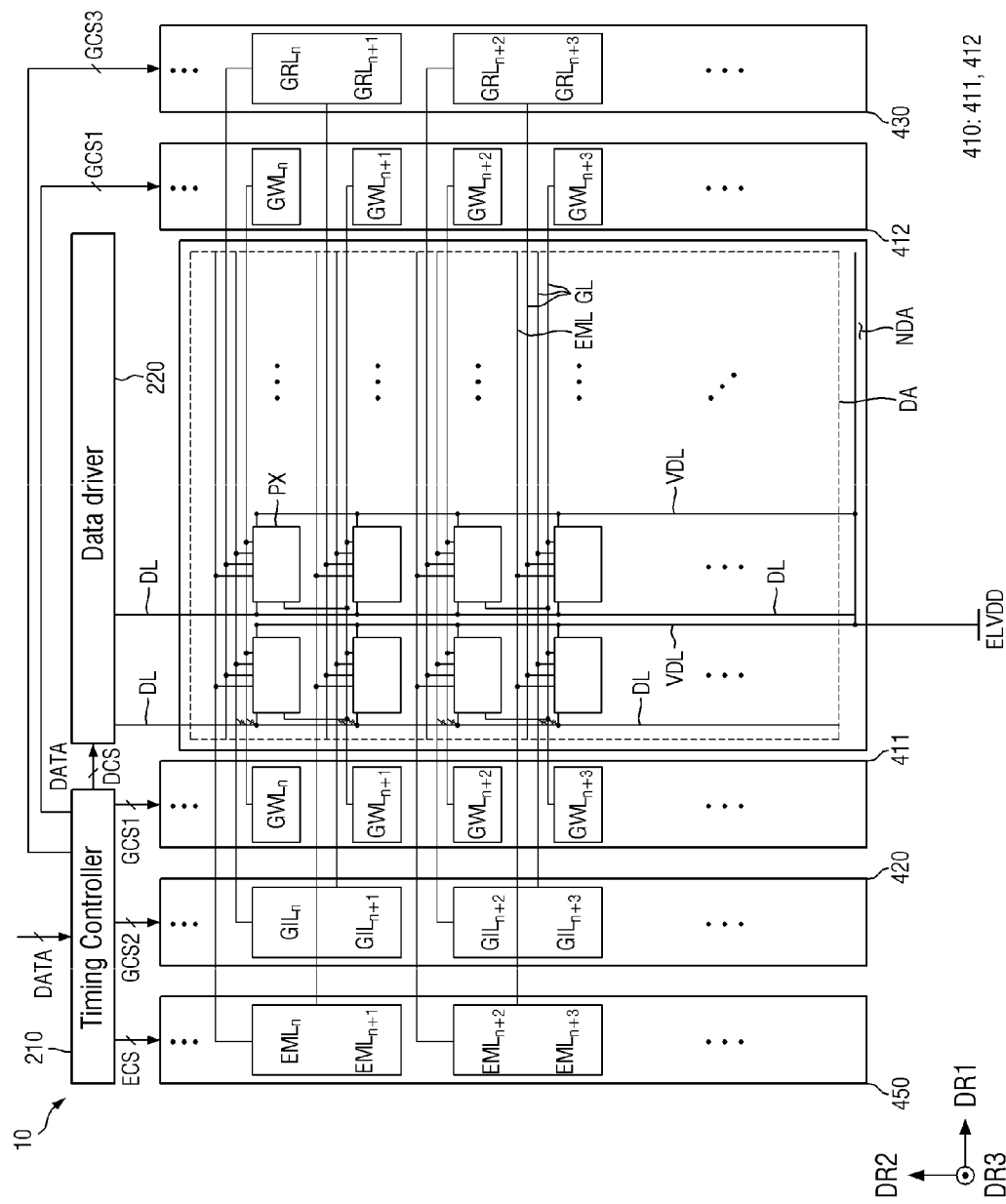
FIG. 3 is a block diagram of a display device according to one embodiment.

FIG. 2 is a plan view of a display device according to one embodiment. FIG. 3 is a block diagram of a display device according to one embodiment.

Referring to FIGS. 2 and 3, sub-pixels PX, and gate lines GL, emission lines EML, data lines DL, and a driving voltage line VDL connected to the sub-pixels PX may be disposed on the display panel 100. The gate lines GL and the emission lines EML may extend in the first direction DR1, and the data lines DL and the driving voltage line VDL may extend in the second direction DR2 crossing the first direction DR1. The driving voltage line VDL may extend in the second direction DR2 in the display area DA. The driving voltage lines VDL may be connected to each other in the non-display area NDA.

Each of the pixels PX may be connected to at least one of the gate lines GL, one of the data lines DL, at least one of the emission lines EML, and the driving voltage line VDL. In FIG. 2, it is illustrated that each of the pixels PX is connected to three gate lines GL, one data line DL, one emission line EML, and the driving voltage line VDL, but the embodiments are not limited thereto. For example, each of the pixels PX may be connected to two or fewer gate lines GL instead of three gate lines GL, or may be connected to four or more gate lines GL.

Each of the pixels PX may include a driving transistor, at least one transistor, a light emitting element, and a capacitor. The driving transistor and the at least one transistor may be a thin film transistor. The at least one transistor may be turned on or off according to a gate signal applied from the gate line to act as a switching element. For example, when a transistor disposed between the data line and the gate electrode of the driving transistor is turned on by a gate signal, the data voltage of the data line may be applied to the gate electrode of the driving transistor. The light emitting element may be an organic light emitting diode including a first electrode, an organic light emitting layer and a second electrode. The light emitting element may emit light according to the driving current of the driving transistor. The capacitor may serve to keep constant the data voltage applied to the gate electrode of the driving transistor.

As illustrated in FIG. 3, the display driving circuit 200 may include a timing controller 210, a data driver 220, and a plurality of voltage lines.

The timing controller 210 may receive digital video data DATA and timing signals from the circuit board 300. The timing controller 210 may generate a plurality of gate control signals GCS1, GCS2, and GCS3 for controlling an operation timing of each of a plurality of gate drivers 410, 420, and 430 according to the timing signals, may generate an emission control signal ECS for controlling an operation timing of an emission control driver 450, and may generate a data control signal DCS for controlling an operation timing of the data driver 220. For example, the timing controller 210 may generate the first gate control signal GCS1, the second gate control signal GCS2, and the third gate control signal GCS3 according to the timing signals. Further, the timing controller 210 may output the first gate control signal GCS1 to the first gate driver 410, output the second gate control signal GCS2 to the second gate driver 420, and output the third gate control signal GCS3 to the third gate driver 430.

The timing controller 210 may output the gate control signals GCS1, GCS2, and GCS3 to the plurality of gate drivers 410, 420, and 430, respectively, through the plurality of gate control lines GCL, and may output the emission control signal ECS to the emission control driver 450. The timing controller 210 may output the digital video data DATA and the data control signal DCS to the data driver 220.

The data driver 220 may convert the digital video data DATA into analog data voltages to output the analog data voltages to the data lines DL through fan-out lines FL.

Each of the plurality of voltage lines may be supplied with a voltage from a power supply unit. The plurality of voltage lines may include the driving voltage line VDL for applying a driving voltage ELVDD and a common voltage line for applying a common voltage. The driving voltage may be a high potential voltage for driving the organic light emitting diode, and the common voltage line may be a low potential voltage for driving the organic light emitting diode. For example, the driving voltage may have a higher potential than the common voltage.

In the non-display area NDA, a gate driving circuit 400 for applying gate signals to the gate lines GL, the fan-out lines FL between the data lines DL and the display driving circuit 200, and the pads DP connected to the display driving circuit 200 may be disposed. The display driving circuit 200 and the pads DP may be disposed adjacent to an edge of one side (e.g., a lower side) of the display panel 100.

The gate driving circuit 400 may be electrically connected to the display driving circuit 200 through the gate control lines GCL. The gate driving circuit 400 may receive the gate control signals GCS1, GCS2, and GCS3 and the emission control signal ECS from the display driving circuit 200 through the gate control lines GCL.

The gate driving circuit 400 may respectively generate gate signals according to the gate control signals GCS, and sequentially output the gate signals to the gate lines GL. Further, the gate driving circuit 400 may generate emission signals according to the emission control signal ECS, and sequentially output the emission signals to the emission lines EML.

The gate driving circuit 400 may include a plurality of thin film transistors. The gate driving circuit 400 may be formed on the same layer as the thin film transistors of the pixels PX. The gate driving circuit 400 may be disposed in the non-display area NDA on both sides (i.e., left and right sides) of the display area DA. Through such a structure, it may be advantageous in reducing the length of the non-display area NDA in the first direction DR1 on each of both sides of the display area DA. However, the embodiments are not limited thereto. For example, the gate driving circuit 400 may be disposed on either the left side or the right side of the display area DA.

The gate driving circuit 400 may include the first gate driver 410, the second gate driver 420, the third gate driver 430, and the emission control driver 450.

Although FIGS. 2 and 3 illustrate that the first gate driver 410 includes a first sub-gate driver 411 disposed on one side of the non-display area NDA, for example, on the left side of the non-display area and a second sub-gate driver 412 disposed on the other side of the non-display area NDA, for example, on the right side of the non-display area NDA, and each of the first sub-gate driver 411 and the second sub-gate driver 412 applies a gate signal, the present disclosure is not limited thereto. The gate driving circuit 400 may include one first gate driver 410, and may be disposed on either one side or the other side of the non-display area DA.

The second gate driver 420 and the third gate driver 430 may be disposed on different sides of the non-display area NDA. For example, as illustrated in FIG. 3, when the second gate driver 420 is disposed on one side of the non-display area NDA, the third gate driver 430 may be disposed on the other side of the non-display area NDA, and conversely, when the second gate driver 420 is disposed on the other side of the non-display area NDA, the third gate driver 430 may be disposed on one side of the non-display area NDA.

At least two voltage lines among voltage lines for applying voltages to the gate lines GL may be connected to each of the gate drivers 410, 420, and 430. The voltage lines for applying a voltage to the emission lines EML may be connected to the emission control driver 450.

Figure 4:
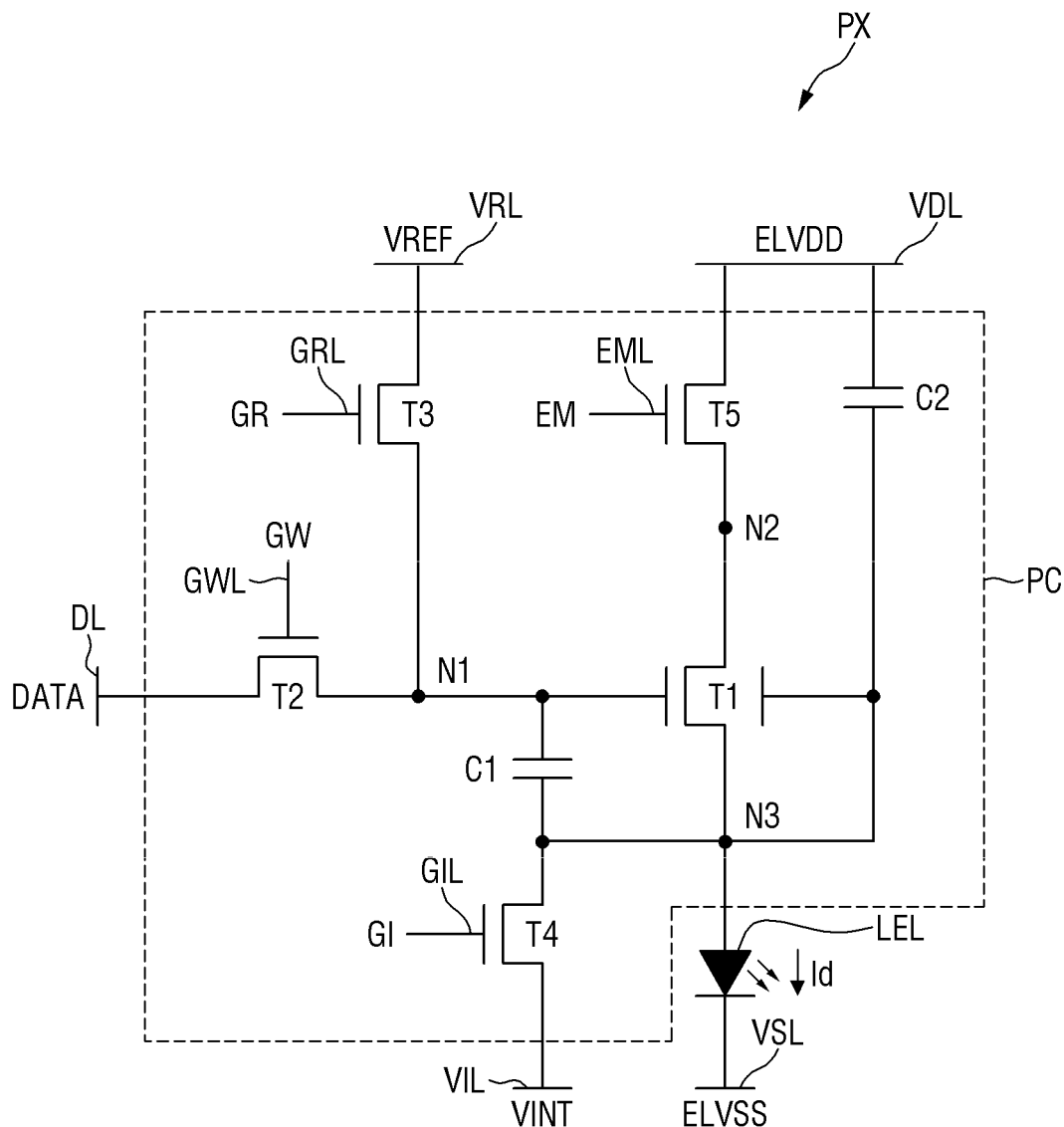
FIG. 4 is a circuit diagram of one pixel of a display device according to one embodiment.

FIG. 4 is a circuit diagram of one pixel of a display device according to one embodiment.

Referring to FIG. 4, the pixel PX may include the light emitting element LEL (e.g., an organic light emitting diode) as a display element and the pixel circuit PC connected to the light emitting element LEL. The pixel circuit PC may include first to fifth transistors T1 to T5 and first and second capacitors C1 and C2. The first transistor T1 may be a driving transistor in which a size of a source-drain current is determined according to a gate-source voltage, and each of the second to fifth transistors T2 to T5 may be a switching transistor that is turned on/off according to the gate-source voltage, substantially a gate voltage. The first to fifth transistors T1 to T5 may be implemented as thin film transistors. According to the type (p-type or n-type) and/or the operating condition of the transistor, the first electrode of each of the first to fifth transistors T1 to T5 may be a source electrode or a drain electrode, and the second electrode may be an electrode different from the first electrode. For example, when the first electrode is the source electrode, the second electrode may be the drain electrode.

The pixel PX may be connected to the first gate line GWL that transmits the first gate signal GW, the second gate line GIL that transmits the second gate signal GI, the third gate line GRL that transmits the third gate signal GR, the emission line EML that transmits an emission signal EM, and a data line DL that transmits a data signal DATA.

The first gate driver 410 (e.g., the first sub-gate driver 411 and the second sub-gate driver 412) may apply the first gate signal GW to the first gate line GWL. The second gate driver 420 may apply the second gate signal GI to the second gate line GIL. The third gate driver 430 may apply the third gate signal GR to the third gate line GRL. The emission control driver 450 may apply the emission signal EM to the emission line EML.

The driving voltage line VDL may transmit the driving voltage ELVDD to the first transistor T1. The initialization voltage line VIL may transmit the initialization voltage VINT to the light emitting element LEL (e.g., an organic light emitting diode). The reference voltage line VRL may transmit the reference voltage VREF to the gate electrode of the first transistor T1. Meanwhile, depending on the pixel structure, the initialization voltage line VIL described above may include a plurality of initialization voltage lines VIL (e.g., a first initialization voltage line and a second initialization voltage line that transmit initialization voltages of different sizes.

A plurality of first to fifth transistors T1 to T5 may include an oxide semiconductor material. Since the oxide semiconductor has high carrier mobility and low leakage current, the voltage drop will not be large even if the driving time may be long. That is, in the case of an oxide semiconductor, since a color change of an image due to a voltage drop is not large even during low-frequency driving, low-frequency driving is possible. Accordingly, a display device preventing the generation of leakage current and having reduced power consumption may be implemented by the plurality of first to fifth transistors T1 to T5 including an oxide semiconductor material. In addition, in the case of using an oxide semiconductor transistor, a crystallization process by excimer laser annealing (ELA) is not required to form a low-temperature polycrystalline silicon (LTPS) semiconductor transistor, and thus the manufacturing cost of the display panel 100 may be reduced, so that it is advantageous for implementation of a large-area display device.

The oxide semiconductor is sensitive to light, so that a fluctuation in current amount and the like may occur due to light from the outside. Accordingly, it may be considered to absorb or reflect light from the outside by positioning a metal layer under the oxide semiconductor. The metal layer positioned below the oxide semiconductor of each of the first to fifth transistors T1 to T5 may function as a lower gate electrode (e.g., a counter gate electrode). That is, the first to fifth transistors T1 to T5 may be double gate transistors having two gate electrodes (e.g., a first gate electrode and a second gate electrode, or a gate electrode and a counter gate electrode).

The first transistor T1 includes the first gate electrode connected to a first node N1 (or gate node), the second gate electrode connected to a third node N3, a first electrode connected to a second node N2, and a second electrode connected to the third node N3. The second gate electrode GE2 of the first transistor T1 may be connected to the second electrode of the first transistor T1 to be controlled by a voltage applied to the second electrode of the first transistor T1, and may improve the output saturation characteristics of the first transistor T1. The first electrode of the first transistor T1 may be connected to the driving voltage line VDL via the fifth transistor T5, and the second electrode may be connected to the pixel electrode (e.g., an anode electrode) of the light emitting element LEL. The first transistor T1 may serve as a driving transistor, and may control the magnitude (e.g., current amount) of a driving current Id flowing to the light emitting element LEL by receiving the data signal DATA according to the switching operation of the second transistor T2.

The second transistor T2 (e.g., data writing transistor) includes a gate electrode connected to the first gate line GWL, a first electrode connected to the data line DL, and a second electrode connected to the first node N1 (or the gate electrode of the first transistor T1). The second transistor T2 may be turned on according to the first gate signal GW transmitted to the first gate line GWL to electrically connect the data line DL to the first node N1, and may transmit the data signal DATA transmitted to the data line DL to the first node N1.

The third transistor T3 (e.g., a first initialization transistor) includes a gate electrode connected to the third gate line GRL, a first electrode connected to the reference voltage line VRL, and a second electrode connected to the first node N1 (or the gate electrode of the first transistor T1). The third transistor T3 may be turned on according to the third gate signal GR transmitted to the third gate line GRL and transmit the reference voltage VREF transmitted to the reference voltage line VRL to the first node N1.

The fourth transistor T4 (e.g., the second initialization transistor) includes a gate electrode connected to the second gate line GIL, a first electrode connected to the third node N3 (or the second electrode of the first transistor T1), and a second electrode connected to the initialization voltage line VIL. The fourth transistor T4 may be turned on according to the second gate signal GI transmitted to the second gate line GIL and transmit the initialization voltage VINT transmitted to the initialization voltage line VIL to the third node N3.

The fifth transistor T5 (e.g., a light emitting transistor) includes a gate electrode connected to the emission line EML, a first electrode connected to the driving voltage line VDL, and a second electrode connected to the second node (or the first electrode of the first transistor T1). The fifth transistor T5 may be turned on or off according to the emission signal EM transmitted to the emission line EML.

The first capacitor C1 may be connected between the first node N1 and the third node N3. The first electrode of the first capacitor C1 may be connected to the gate electrode of the first transistor T1, and the second terminal thereof may be connected to the second gate electrode GE2 and the second electrode of the first transistor T1, the first electrode of the fourth transistor T4, and the pixel electrode (e.g., anode electrode) of the light emitting element LEL. The first capacitor C1 may be a storage capacitor and may store a voltage corresponding to a threshold voltage and a data signal of the first transistor T1.

The second capacitor C2 may be connected between the third node N3 and the driving voltage line VDL. The first electrode of the second capacitor C2 may be connected to the driving voltage line VDL, and the second electrode thereof may be connected to the second gate electrode GE2 and the second electrode of the first transistor T1, the second electrode of the first capacitor C1, the first electrode of the fourth transistor T4, and the pixel electrode of the light emitting element LEL. The capacitance of the first capacitor C1 may be greater than the capacitance of the second capacitor C2.

The light emitting element LEL may include a pixel electrode (e.g., an anode electrode) and a counter electrode (e.g., a cathode electrode) facing the pixel electrode, and the counter electrode may be applied with a common voltage ELVSS. The counter electrode may be connected to a common voltage line VSL transmitting a common voltage. The counter electrode may be a common electrode commonly shared by the plurality of pixels PX.

Figure 5:
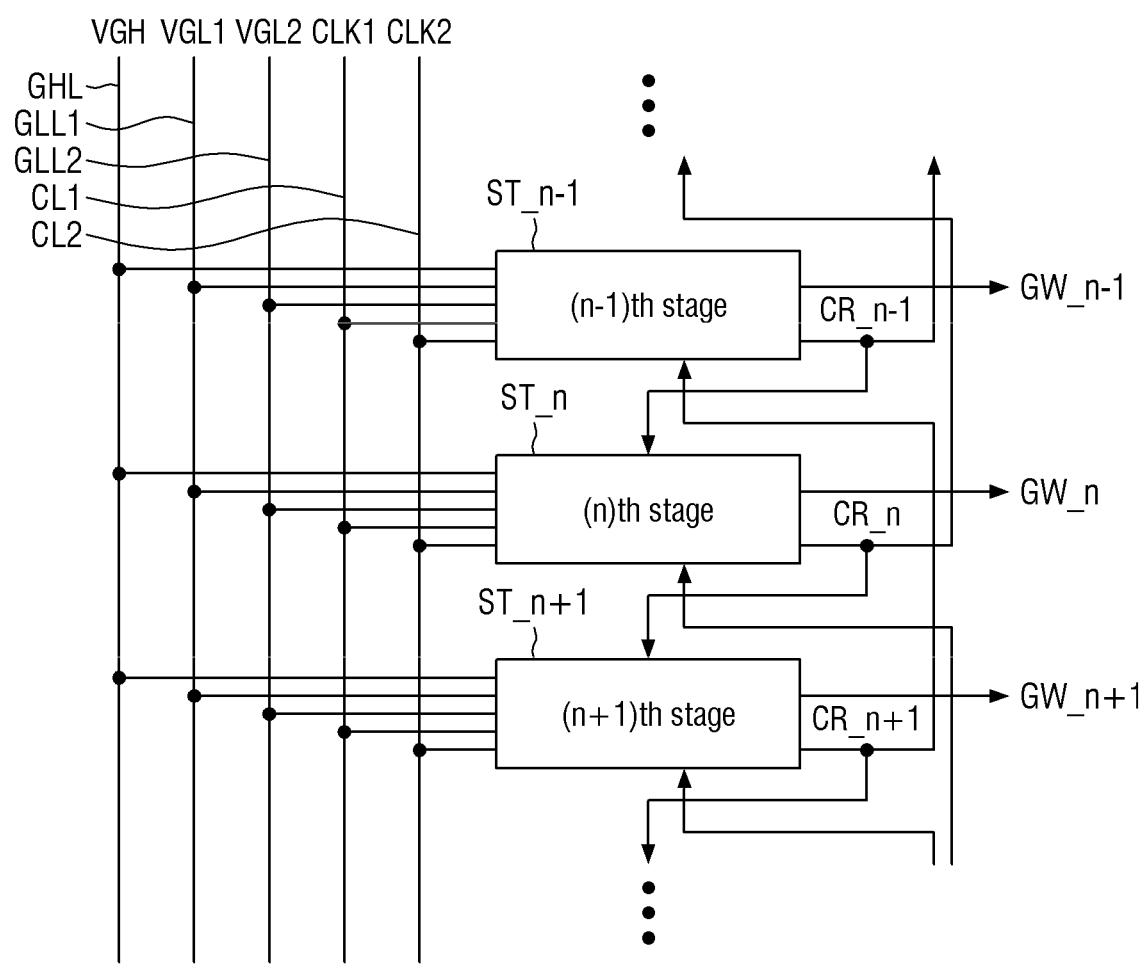
FIG. 5 is a block diagram of the first sub-gate driver of FIG. 3.

FIG. 5 is a block diagram of the first sub-gate driver 411 of FIG. 3.

As shown in FIG. 5, the first sub-gate driver 411 may include a plurality of stages.

Each of stages ST_n−1, ST_n, and ST_n+1 may receive a gate high voltage VGH, a first gate low voltage VGL1, a second gate low voltage VGL2, a first clock signal CLK1, and a second clock signal CLK2. To this end, each of the stages ST_n−1, ST_n, and ST_n+1 may be connected to a gate high voltage line GHL, a first gate low voltage line GLL1, a second gate low voltage line GLL2, a first clock line CL1, and a second clock line CL2.

The gate high voltage VGH may be provided from the gate high voltage line GHL. The first gate low voltage VGL1 may be provided from the first gate low voltage line GLL1. The second gate low voltage VGL2 may be provided from the second gate low voltage line GLL2. The first clock signal CLK1 may be provided from the first clock line CL1. The second clock signal CLK2 may be provided from the second clock line CL2. The gate high voltage VGH may be greater than the first gate low voltage VGL1 and the second gate low voltage VGL2. The second gate low voltage VGL2 may be lower than the first gate low voltage VGL1. The first clock signal CLK1 and the second clock signal CLK2 may have different phases. In this case, the first gate high voltage VGH, the high voltage of the first clock signal CLK1, and the high voltage of the second clock signal CLK2 may be greater than the threshold voltage of each transistor. In addition, the first gate low voltage VGL1, the second gate low voltage VGL2, the low voltage of the first clock signal CLK1, and the low voltage of the second clock signal CLK2 may be smaller than the threshold voltage of each transistor.

Each of the stages ST_n−1, ST_n, and ST_n+1 may output a first gate signal and a carry signal. For example, the $n^{th}$ stage ST_n may output an $n^{th}$ first gate signal GW_n and an $n^{th}$ carry signal CR_n. The $n^{th}$ first gate signal GW_n from the $n^{th}$ stage ST_n may be applied to an $n^{th}$ first gate line. The $n^{th}$ carry signal CR_n from the $n^{th}$ stage ST_n may be applied to at least one of a previous stage or a subsequent stage.

Each of the stages ST_n−1, ST_n, and ST_n+1 may be connected to at least one of a previous stage or a subsequent stage. For example, an $n^{th}$ gate output terminal of the $n^{th}$ stage ST_n may be connected to an $(n-2)^{th}$ stage and the $(n+1)^{th}$ stage ST_n+1.

Each of the stages ST_n−1, ST_n, and ST_n+1 may be set by a carry signal from a previous stage and reset by a carry signal from a subsequent stage. For example, the $n^{th}$ stage ST_n may be set by an $(n-1)^{th}$ carry signal CR_n−1 from the $(n-1)^{th}$ stage ST_n−1, and may be reset by an $(n+2)^{th}$ carry signal from an $(n+2)^{th}$ stage.

Meanwhile, during one frame period, a first stage, which outputs a first gate signal first among the stages, may be set by a frame line mark signal instead of a carry signal. Further, during one frame period, a first stage, which outputs a first gate signal last among the stages, may be reset by a carry signal from a separate dummy stage. The dummy stage may not output a first gate signal.

Figure 6:
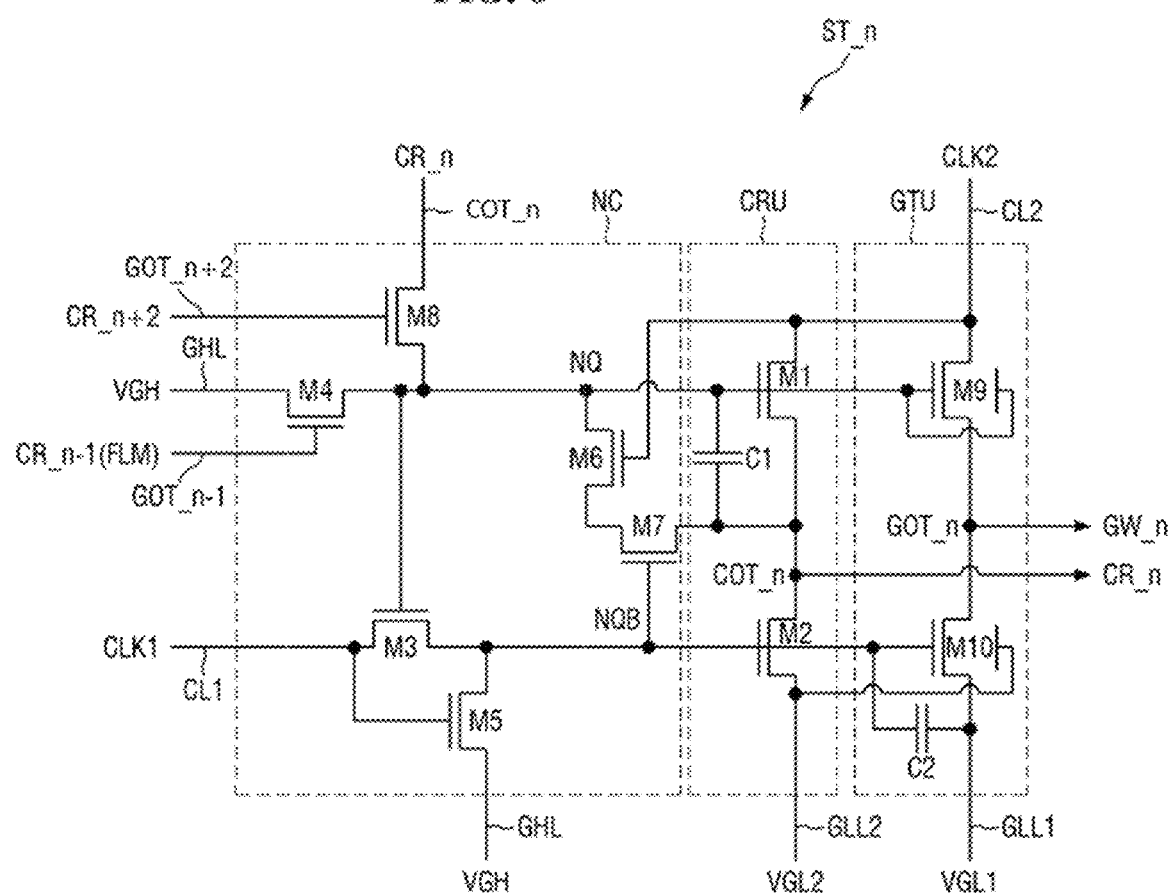
FIG. 6 is a detailed configuration diagram of the n$^{th}$ stage of FIG. 5.

FIG. 6 is a detailed configuration diagram of the $n^{th}$ stage ST_n of FIG. 5.

As shown in FIG. 6, the $n^{th}$ stage ST_n may include a node control unit NC, a carry output unit CRU, and a gate output unit GTU.

The $n^{th}$ stage ST_n may include first to tenth transistors M1 to M10, a first capacitor C1, and a second capacitor C2. For example, the node control unit NC may include the third to eighth transistors M3 to M8. The carry output unit CRU may include the first transistor M1 and the second transistor M2. The gate output unit GTU may include the ninth transistor M9 and the tenth transistor M10. In this case, the ninth transistor M9 and the tenth transistor M10 may be output transistors that output the $n^{th}$ first gate signal GW_n. For example, the ninth transistor M9 may be a pull-up transistor and the tenth transistor M10 may be a pull-down transistor.

A gate electrode of the first transistor M1 may be connected to a set node NQ, a drain electrode of the first transistor M1 may be connected to the second clock line CL2, and a source node of the first transistor M1 may be connected to a carry output terminal COT_n.

A gate electrode of the second transistor M2 may be connected to a reset node NQB, a drain electrode of the second transistor M2 may be connected to the carry output terminal COT_n, and a source electrode of the second transistor M2 may be connected to the second gate low voltage line GLL2.

A gate electrode of the third transistor M3 may be connected to the set node NQ, a drain electrode of the third transistor M3 may be connected to the first clock line CL1, and a source electrode of the third transistor M3 may be connected to the reset node NQB.

A gate electrode of the fourth transistor M4 may be connected to a start signal line or a carry output terminal COT_n−1 of the $(n-1)^{th}$ stage ST_n−1, a drain electrode of the fourth transistor M4 may be connected to the gate high voltage line GHL, and a source electrode of the fourth transistor M4 may be connected to the set node NQ. In this case, the frame line mark signal described above may be applied to the start signal line, for example.

A gate electrode of the fifth transistor M5 may be connected to the first clock line CL1, a drain electrode of the fifth transistor M5 may be connected to the gate high voltage line GHL, and a source electrode of the fifth transistor M5 may be connected to the reset node NQB.

A gate electrode of the sixth transistor M6 may be connected to the second clock line CL2, a drain electrode of the sixth transistor M6 may be connected to the set node NQ, and a source electrode of the sixth transistor M6 may be connected to a source electrode of the seventh transistor M7.

A gate electrode of the seventh transistor M7 may be connected to the reset node NQB, a drain electrode of the seventh transistor M7 may be connected to the carry output terminal COT_n, and the source electrode of the seventh transistor M7 may be connected to the source electrode of the sixth transistor M6.

A gate electrode of the eighth transistor M8 may be connected to a carry output terminal COT_n+2 of the $(n+2)^{th}$ stage, a drain electrode of the eighth transistor M8 may be connected to the set node NQ, and a source electrode of the eighth transistor M8 may be connected to the carry output terminal COT_n.

A gate electrode of the ninth transistor M9 may be connected to the set node NQ, a drain electrode of the ninth transistor M9 may be connected to the second clock line CL2, and a source electrode of the ninth transistor M9 may be connected to a gate output terminal GOT_n. Meanwhile, a gate electrode of the ninth transistor M9 may include a lower gate electrode (or a counter gate electrode) and an upper gate electrode. In other words, the ninth transistor M9 may include a lower gate electrode and an upper gate electrode connected to each other.

A gate electrode of the tenth transistor M10 may be connected to the reset node NQB, a drain electrode of the tenth transistor M10 may be connected to the gate output terminal GOT_n, and a source electrode of the tenth transistor M10 may be connected to the first gate low voltage line GLL1. Meanwhile, the gate electrode of the tenth transistor M10 may include a lower gate electrode (or a counter gate electrode) and an upper gate electrode. The upper gate electrode of the tenth transistor M10 may be connected to the reset node NQB, and the lower gate electrode of the tenth transistor M10 may be connected to the second gate low voltage line GLL2. The second gate low voltage VGL2 from the second gate low voltage line GLL2 may be applied as a bias voltage to the lower gate electrode of the tenth transistor M10. Meanwhile, a width of a channel region of the ninth transistor M9 described above may be greater than that of a channel region of the tenth transistor M10.

The first electrode of the first capacitor C1 may be connected to the set node NQ, and the second electrode of the first capacitor C1 may be connected to the carry output terminal COT_n.

The first electrode of the second capacitor C2 may be connected to the reset node NQB, and the second electrode of the second capacitor C2 may be connected to the first gate low voltage line GLL1.

Figure 7:
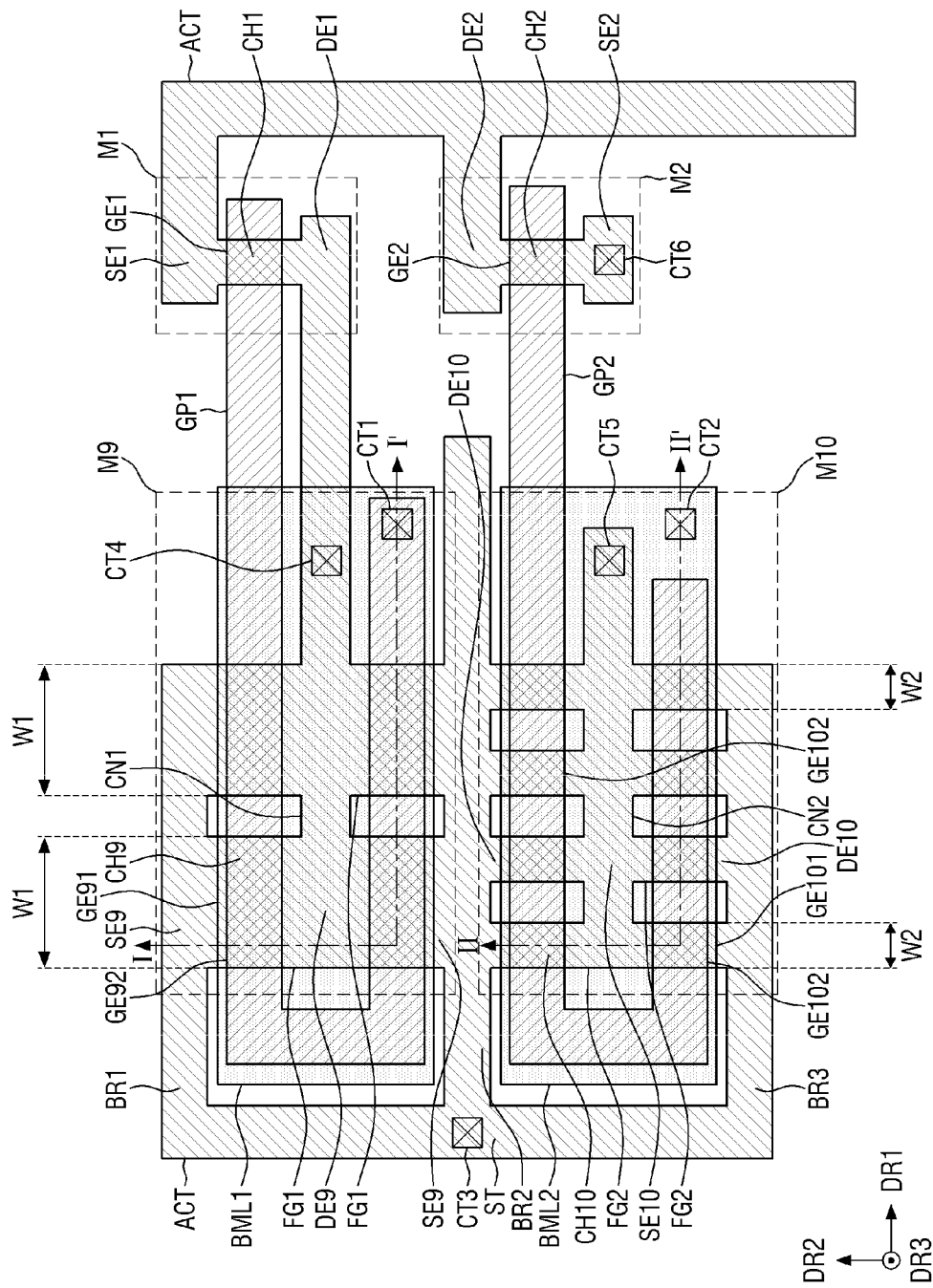
FIG. 7 is a plan view illustrating a layout of the first transistor, the second transistor, the ninth transistor, and the tenth transistor of FIG. 6.
Figure 8:
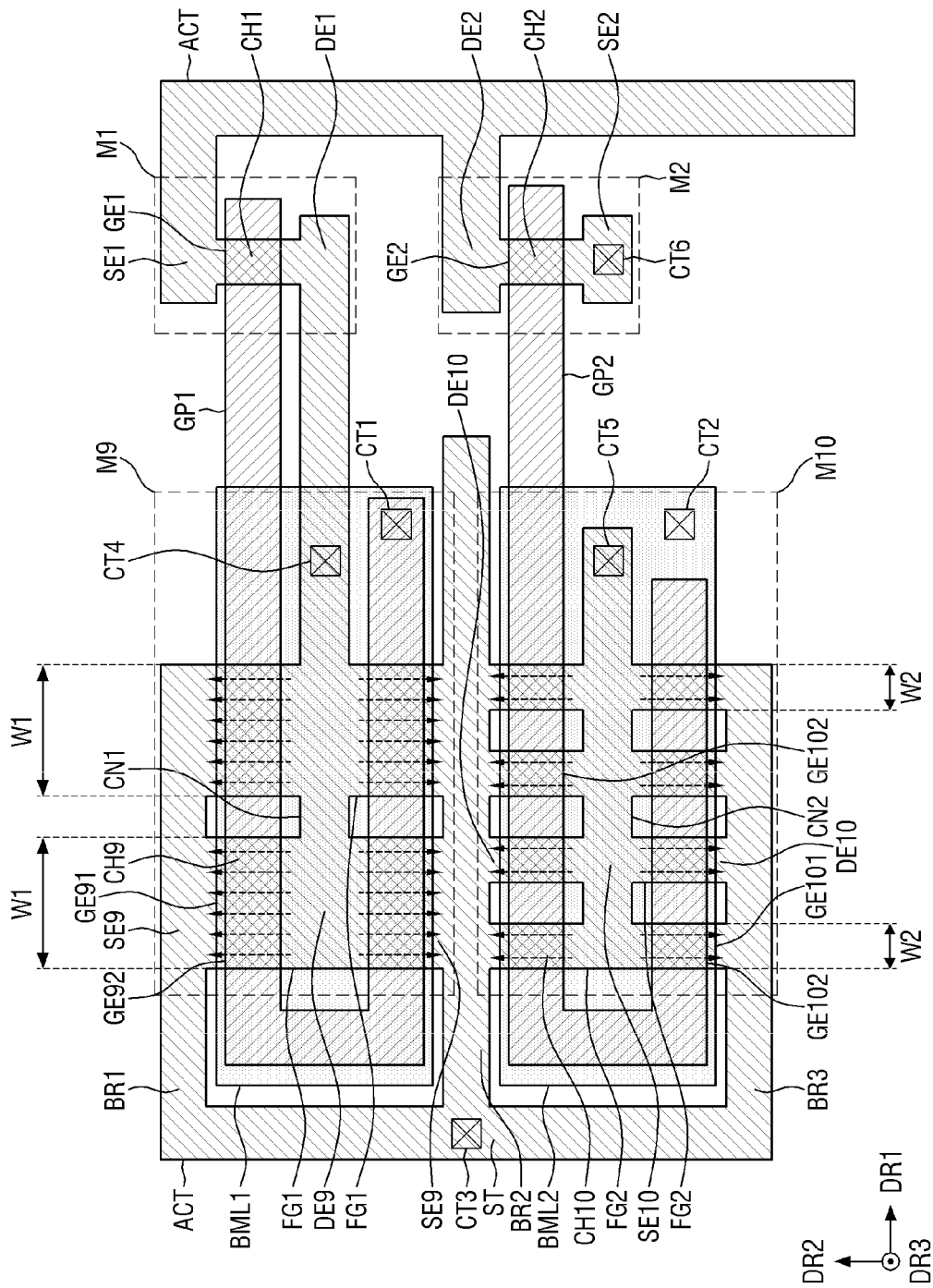
FIG. 8 is a view for describing a current driving capability of the ninth transistor and the tenth transistor of FIG. 7.

FIG. 7 is a plan view illustrating a layout of the first transistor M1, the second transistor M2, the ninth transistor M9, and the tenth transistor M10 of FIG. 6. FIG. 8 is a view for describing a current driving capability of the ninth transistor M9 and the tenth transistor M10 of FIG. 7.

The first transistor M1 may include a channel region CH1 (hereinafter, a first channel region CH1), a gate electrode GE1 (hereinafter, a first gate electrode GE1), a drain electrode DE1 (hereinafter, a first drain electrode DE1), and a source electrode SE1 (hereinafter, a first source electrode SE1). The first channel region CH1 may be disposed in an overlapping region between the active layer ACT and the first gate electrode GE1. For example, a region of the active layer ACT overlapping the first gate electrode GE1 may be the aforementioned first channel region CH1. Further, regions of the active layer ACT disposed on both sides of the first channel region CH1 may be the first drain electrode DE1 and the first source electrode SE1, respectively.

The second transistor M2 may include a channel region CH2 (hereinafter, a second channel region CH2), a gate electrode GE2 (hereinafter, a second gate electrode GE2), a drain electrode DE2 (hereinafter, a second drain electrode DE2), and a source electrode SE2 (hereinafter, a second source electrode SE2). The second channel region CH2 may be disposed in an overlapping region between the active layer ACT and the second gate electrode GE2. For example, a region of the active layer ACT overlapping the second gate electrode GE2 may be the aforementioned second channel region CH2. Further, regions of the active layer ACT disposed on both sides of the second channel region CH2 may be the second drain electrode DE2 and the second source electrode SE2, respectively.

The ninth transistor M9 may include a channel region CH9 (hereinafter, a ninth channel region CH9), a lower gate electrode GE91 (hereinafter, a ninth lower gate electrode GE91), an upper gate electrode GE92 (hereinafter, a ninth upper gate electrode GE92), a drain electrode DE9 (hereinafter, a ninth drain electrode DE9), and a source electrode SE9 (hereinafter, a ninth source electrode SE9). The ninth channel region CH9 may be disposed in an overlapping region between the active layer ACT and a ninth gate electrode (e.g., at least one of the ninth upper gate electrode GE92 or the ninth lower gate electrode GE91). For example, a region of the active layer ACT overlapping the ninth upper gate electrode GE92 may be the aforementioned ninth channel region CH9. Further, regions of the active layer ACT disposed on both sides of the ninth channel region CH9 may be the ninth drain electrode DE9 and the ninth source electrode SE9, respectively.

The tenth transistor M10 may include a channel region (hereinafter, a tenth channel region CH10), a lower gate electrode (hereinafter, a tenth lower gate electrode GE101), an upper gate electrode (hereinafter, a tenth upper gate electrode GE102), a drain electrode (hereinafter, a tenth drain electrode DE10), and a source electrode (hereinafter, a tenth source electrode SE10). The tenth channel region CH10 may be disposed in an overlapping region between the active layer ACT and a tenth gate electrode (e.g., at least one of the tenth upper gate electrode GE102 or the tenth lower gate electrode GE101). For example, a region of the active layer ACT overlapping the tenth upper gate electrode GE102 may be the aforementioned tenth channel region CH10. Further, regions of the active layer ACT disposed on both sides of the tenth channel region CH10 may be the tenth drain electrode DE10 and the tenth source electrode SE10, respectively.

The ninth channel region CH9 of the ninth transistor M9 (corresponding to a pull-up transistor) has a width W1. The tenth channel region CH10 of the tenth transistor M10 (corresponding to a pull-down transistor) has a width W2. The ninth channel region CH9 may be wider than the tenth channel region CH10 (width W1>width W2, wherein width is measured in the first direction DR1). For example, the width W1 of the ninth channel region CH9 of the ninth transistor M9 may be greater than or equal to 7 µm and less than or equal to 12 µm. The width W2 of the tenth channel region CH10 of the tenth transistor M10 may be greater than or equal to 3 µm and less than or equal to 7 µm. Accordingly, the ninth transistor M9 that is a pull-up transistor may have a greater current driving capability than the tenth transistor M10 that is a pull-down transistor. In other words, as illustrated in FIG. 8, an amount of current flowing through the turned-on ninth transistor M9 may be greater than an amount of current flowing through the turned-on tenth transistor M10. Dotted arrows in FIG. 8 indicate a flow of current flowing from the ninth drain electrode DE9 of the ninth transistor M9 toward the ninth source electrode SE9 thereof and a flow of current flowing from the tenth source electrode SE10 of the tenth transistor M10 to the tenth drain electrode DE10 thereof. As shown in the same drawing, the amount of current flowing through the ninth transistor M9 is greater than the amount of current flowing through the tenth transistor M10.

The width W1 of the ninth channel region CH9 described above may be a size of the facing surfaces of the ninth drain electrode DE9 and the ninth source electrode SE9 that are disposed with the ninth channel region CH9 interposed therebetween. For example, the width W1 of the ninth channel region CH9 may be a size of the ninth channel region CH9 in the first direction DR1. Similarly, the width W2 of the tenth channel region CH10 described above may be a size of the facing surfaces of the tenth drain electrode DE10 and the tenth source electrode SE10 that are disposed with the tenth channel region CH10 interposed therebetween. For example, the width W2 of the tenth channel region CH10 may be a size of the tenth channel region CH10 in the first direction DR1. Meanwhile, a length of the ninth channel region CH9 may be a distance between the ninth drain electrode DE9 and the ninth source electrode SE9 that are disposed with the ninth channel region CH9 interposed therebetween. The length of the ninth channel region CH9 may be a size of the ninth channel region CH9 in the second direction DR2. Similarly, a length of the tenth channel region CH10 may be a distance between the tenth drain electrode DE10 and the tenth source electrode SE10 that are disposed with the tenth channel region CH10 interposed therebetween. For example, the length of the tenth channel region CH10 may be a size of the tenth channel region CH10 in the second direction DR2.

The aforementioned ninth lower gate electrode GE91 may be included in the first light blocking layer BML1. In other words, the ninth lower gate electrode GE91 may be a part of the first light blocking layer BML1. The first light blocking layer BML1 may overlap the ninth channel region CH9 and the ninth upper gate electrode GE92.

The aforementioned first gate electrode GE1 and the ninth upper gate electrode GE92 may be integrally formed. In other words, a structure including the first gate electrode GE1 and the ninth upper gate electrode GE92 (hereinafter, a first gate pattern GP1) may have a U shape opened in the first direction DR1. The ninth upper gate electrode GE92 may be connected to the first light blocking layer BML1 through a first contact hole CT1 penetrating an insulating layer.

The aforementioned tenth lower gate electrode GE101 may be included in the second light blocking layer BML2. In other words, the tenth lower gate electrode GE101 may be a part of the second light blocking layer BML2. The second light blocking layer BML2 may overlap the tenth channel region CH10 and the tenth upper gate electrode GE102.

The aforementioned second gate electrode GE2 and the tenth upper gate electrode GE102 may be integrally formed. In other words, a structure including the second gate electrode GE2 and the tenth upper gate electrode GE102 (hereinafter, a second gate pattern GP2) may have a U shape opened in the first direction DR1. The tenth upper gate electrode GE102 may be connected to the second gate low voltage line GLL2 through a second contact hole CT2 penetrating an insulating layer.

The active layer ACT may be an oxide semiconductor. For example, the active layer ACT may be an oxide semiconductor including indium-gallium-zinc oxide (IGZO) or an oxide semiconductor including indium-gallium-zinc-tin oxide (IGZTO). Meanwhile, when the active layer ACT is an oxide semiconductor, the first gate signal GW_n, which is generated by the N-type ninth transistor M9 and tenth transistor M10 including the active layer ACT, may generally have a large deviation in the rising time and the falling time. For example, the rising time of the first gate signal GW_n, which is affected by the current driving capability of the ninth transistor M9 that is a pull-up transistor, may be greater than the falling time of the first gate signal GW_n, which is affected by the current driving capability of the tenth transistor M10 that is a pull-down transistor. Accordingly, the output waveform of the first gate signal GW_n may be distorted. However, according to the present disclosure, since the channel region (e.g., the ninth channel region CH9) of the pull-up transistor (e.g., the ninth transistor M9) has a larger width than the channel region (e.g., the tenth channel region CH10) of the pull-down transistor (e.g., the tenth transistor M10), the current driving capability of the ninth transistor M9 may be more improved than the current driving capability of the tenth transistor M10. In other words, an amount of current flowing through the turned-on ninth transistor M9 may be greater than an amount of current flowing through the turned-on tenth transistor M10. Accordingly, the deviation between the falling time and the rising time of the first gate signal GW_n is minimized, so that the output of the first gate signal GW_n may be stabilized. Also, since the channel width of the pull-down transistor (e.g., the tenth transistor M10) may be decreased, the size of the pull-down transistor may be decreased. Accordingly, the output of the first gate driver 411 may be stabilized and the size of the first gate driver 410 may be decreased. When the size of the first gate driver 410 is decreased, the area of the non-display area (e.g., a dead space) where the first gate driver 410 is disposed may be decreased.

The active layer ACT may be connected to the gate output terminal GOT_n disposed thereabove through the third contact hole CT3 penetrating an insulating layer. Also, the active layer ACT may be connected to a drain connection terminal disposed thereabove through a fourth contact hole CT4 penetrating the insulating layer. Also, the active layer ACT may be connected to a first source connection terminal disposed thereabove through a fifth contact hole CT5 penetrating the insulating layer. Also, the active layer ACT may be connected to a second source connection terminal disposed thereabove through a sixth contact hole penetrating the insulating layer.

As shown in FIG. 7, the active layer ACT may include a stem portion ST, a first branch portion BR1, a second branch portion BR2, a third branch portion BR3, a first connection portion CN1, a second connection portion CN2, at least one first finger portion FG1, and at least one second finger portion FG2.

The stem portion ST may extend along the second direction DR2.

The first branch portion BR1 may extend from the upper edge of the stem portion ST along the first direction DR1.

The second branch portion BR2 may be disposed between the first branch portion BR1 and the third branch portion BR3. The second branch portion BR2 may extend from the center of the stem portion ST along the first direction DR1.

The third branch portion BR3 may extend from the lower edge of the stem portion ST along the first direction DR1.

The first finger portion FG1 may be disposed between the first branch portion BR1 and the second branch portion BR2. The first finger portion FG1 may extend along the second direction DR2. One side of the first finger portion FG1 may be connected to the first branch portion BR1, and the other side of the first finger portion FG1 may be connected to the second branch portion BR2. The first finger portion FG1 may overlap the first gate pattern GP1. The ninth channel region CH9 of the ninth transistor M9 described above may be defined by an overlapping region between, for example, the first finger portion FG1 and the first gate pattern GP1 (or the ninth upper gate electrode GE92 of the first gate pattern GP1). The first finger portion FG1 may be provided in plural number. For example, as shown in FIG. 7, two first finger portions FG1 may be disposed between the first branch portion BR1 and the second branch portion BR2 while being separated from each other. Meanwhile, one first finger portion FG1 or four or more first finger portions FG1 may be disposed between the first branch portion BR1 and the second branch portion BR2. The first finger portion FG1 may overlap the first gate pattern GP1. The aforementioned first channel region CH1 and ninth channel region CH9 may be disposed in a part of the first finger portion FG1, which overlaps the first gate pattern GP1. A part of the first finger portion FG1, which is disposed in a curved portion of the first gate pattern GP1, may include the ninth drain electrode DE9 of the ninth transistor M9. Parts of the first finger portion FG1, which are respectively disposed above and below the first gate pattern GP1, may include the ninth source electrode SE9 of the ninth transistor M9.

The first connection portion CN1 may be disposed between the adjacent first finger portions FG1. The first connection portion CN1 may extend along the first direction DR1.

The second finger portion FG2 may be disposed between the second branch portion BR2 and the third branch portion BR3. The second finger portion FG2 may extend along the second direction DR2. One side of the second finger portion FG2 may be connected to the second branch portion BR2, and the other side of the second finger portion FG2 may be connected to the third branch portion BR3. The second finger portion FG2 may overlap the second gate pattern GP2. The tenth channel region CH10 of the tenth transistor M10 described above may be defined by an overlapping region between, for example, the second finger portion FG2 and the second gate pattern GP2 (or the tenth upper gate electrode GE102 of the second gate pattern GP2). The second finger portion FG2 may be provided in plural number. For example, as shown in FIG. 7, four second finger portions FG2 may be disposed between the second branch portion BR2 and the third branch portion BR3 while being separated from each other. Meanwhile, three or less second finger portions FG2 or five or more second finger portions FG2 may be disposed between the second branch portion BR2 and the third branch portion BR3. The second finger portion FG2 may overlap the second gate pattern GP2. The aforementioned second channel region CH2 and tenth channel region CH10 may be disposed in a part of the second finger portion FG2, which overlaps the second gate pattern GP2. A part of the second finger portion FG2, which is disposed in a curved portion of the second gate pattern GP2, may include the tenth source electrode SE10 of the tenth transistor M10. Parts of the second finger portion FG2, which are respectively disposed above and below the second gate pattern GP2, may include the tenth drain electrode DE10 of the tenth transistor M10.

The second connection portion CN2 may be disposed between the adjacent second finger portions FG2. The second connection portion CN2 may extend along the first direction DR1.

The number of the first finger portions FG1 and the number of the second finger portions FG2 may be the same or different. For example, the number of the second finger portions FG2 may be greater than the number of the first finger portions FG1.

The first finger portion FG1 may include the ninth channel region CH9, and the second finger portion FG2 may include the tenth channel region CH10. A width (e.g., a width W1) of the first finger portion FG1 in the first direction DR1 may be greater than a width (e.g., a width W2) of the second finger portion FG2 in the first direction DR1.

A size of the first finger portion FG1 in the second direction DR2 may be the same as or different from a size of the second finger portion FG2 in the second direction DR2. For example, the size of the first finger portion FG1 in the second direction DR2 may be greater than the size of the second finger portion FG2 in the second direction DR2.

An area of the first finger portion FG1 may be greater than that of the second finger portion FG2. Meanwhile, when each of the first finger portion FG1 and the second finger portion FG2 is provided in plural number, the total area of the plurality of first finger portions FG1 may be greater than the total area of the plurality of second finger portions FG2.

Figure 9:
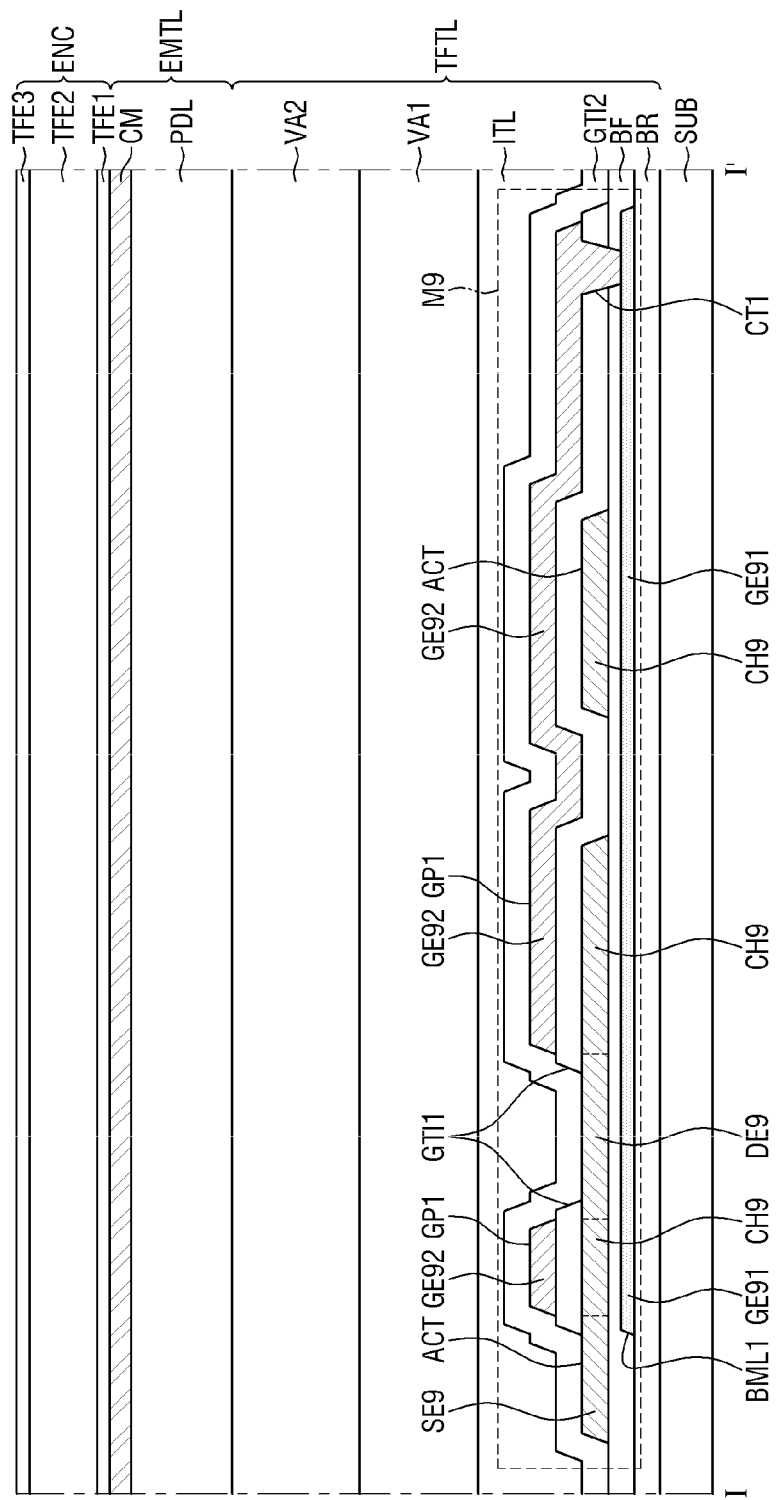
FIG. 9 is a cross-sectional view taken along line I-I' of FIG. 7.
Figure 10:
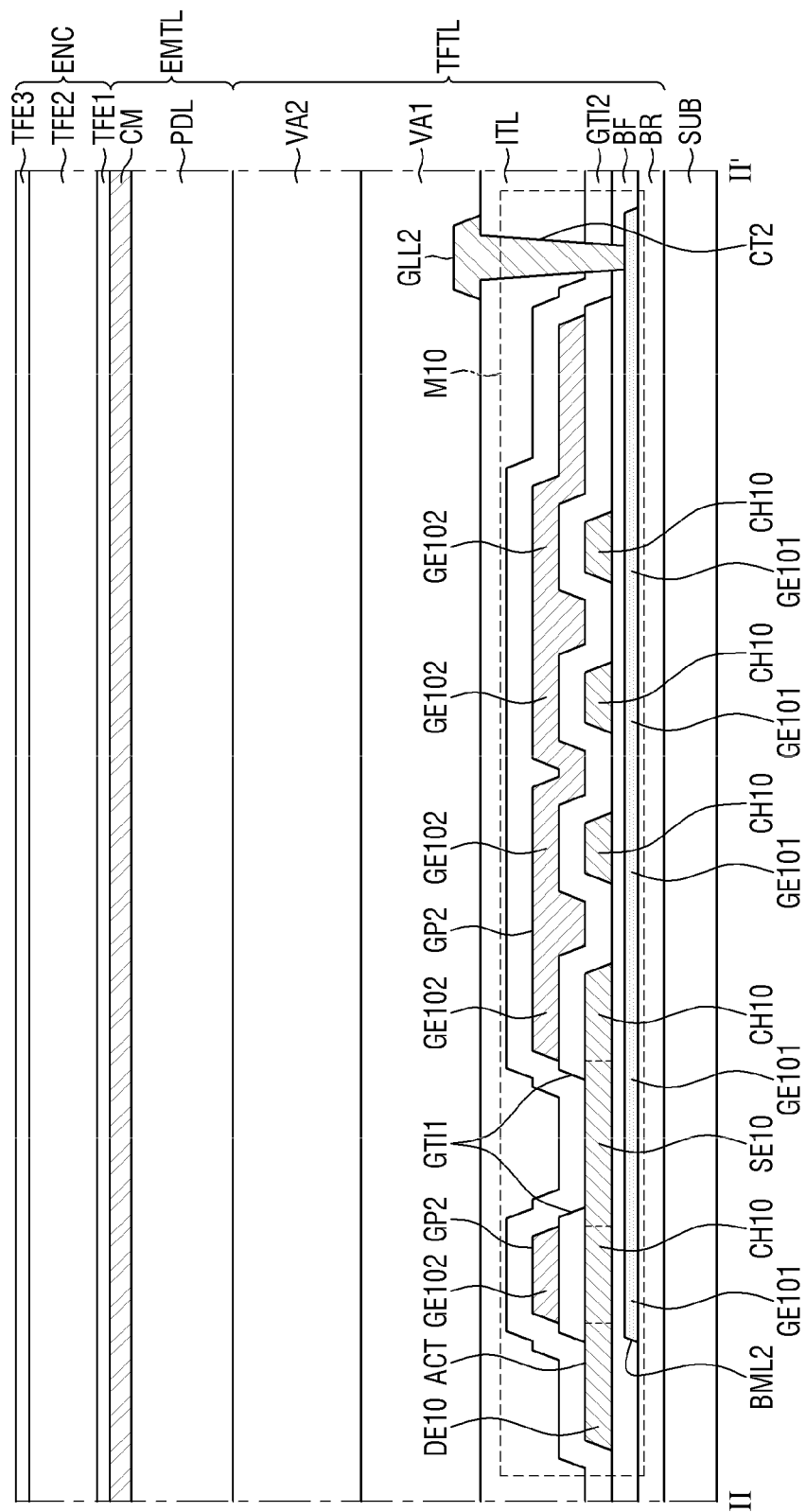
FIG. 10 is a cross-sectional view taken along line II-II' of FIG. 7.

FIG. 9 is a cross-sectional view taken along line I-I' of FIG. 7, and FIG. 10 is a cross-sectional view taken along line II-II' of FIG. 7.

As illustrated in FIGS. 9 to 10, the display device 10 may include the substrate SUB, a barrier layer BR, a buffer layer BF, a thin film transistor layer TFTL, a light emitting element layer EMTL, and an encapsulation layer ENC. As illustrated in FIGS. 9 to 10, the display device 10 may include the substrate SUB, a barrier layer BR, a buffer layer BF, a thin film transistor layer TFTL, a light emitting element layer EMTL, and an encapsulation layer ENC.

The substrate SUB may be a rigid substrate or a flexible substrate which can be bent, folded or rolled. The substrate SUB may be formed of an insulating material such as glass, quartz, or a polymer resin. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate CTA, cellulose acetate propionate (CAP), or a combination thereof. Alternatively, the substrate SUB may include a metal material.

The barrier layer BR may be disposed on the substrate SUB. The barrier layer BR may be a layer for protecting transistors of the thin film transistor layer TFTL and a light emitting layer EL of the light emitting element layer EMTL from moisture permeating through the substrate SUB which is susceptible to moisture permeation. The barrier layer BR may be formed as a plurality of inorganic layers. For example, the barrier layer BR may be formed of multiple layers in which one or more inorganic layers of a silicon nitride layer, a silicon oxynitride layer, a silicon oxide layer, a titanium oxide layer and an aluminum oxide layer are stacked.

The first light blocking layer BML1 and the second light blocking layer BML2 may be disposed on the barrier layer BR. The first light blocking layer BML1 may include the ninth lower gate electrode GE91, and the second light blocking layer BML2 may include the tenth lower gate electrode GE101.

The buffer layer BF may be disposed on the first light blocking layer BML1 and the second light blocking layer BML2. The buffer layer BF may be disposed on the entire surface of the substrate SUB including the first and second light blocking layers BML1 and BML2. The buffer layer BF may be a layer for protecting transistors of the thin film transistor layer TFTL and a light emitting layer EL of the light emitting element layer EMTL from moisture permeating through the substrate SUB which is susceptible to moisture permeation. The buffer layer BF may be formed of a plurality of inorganic layers. For example, the buffer layer BF may be formed of multiple layers in which one or more inorganic layers of a silicon nitride layer, a silicon oxynitride layer, a silicon oxide layer, a titanium oxide layer and an aluminum oxide layer are stacked.

The active layer ACT may be disposed on the buffer layer BF. For example, as shown in FIGS. 9 and 10, the active layer ACT may be disposed on the buffer layer BF such that the ninth channel region CH9 of the active layer ACT overlaps the ninth lower gate electrode GE91 in the third direction DR3 and the tenth channel region CH10 of the active layer ACT overlaps the tenth lower gate electrode GE101 in the third direction DR3. The active layer ACT may be, for example, an oxide semiconductor. For example, the active layer ACT may be an oxide semiconductor including indium-gallium-zinc oxide (IGZO) or an oxide semiconductor including indium-gallium-zinc-tin oxide (IGZTO).

A first gate insulating layer GTI1 may be disposed on the active layer ACT. For example, as shown in FIGS. 9 and 10, the first gate insulating layer GTI1 may be disposed to cover the channel region (e.g., the ninth channel region CH9) of the active layer ACT. For example, since the active layer ACT includes the tenth channel region CH10 and the ninth channel region CH9 of the ninth transistor M9, the first gate insulating layer GTI1 may be disposed on the active layer ACT to overlap the ninth channel region CH9 and the tenth channel region CH10 in the third direction DR3. Meanwhile, when the first active layer ACT includes a plurality of channel regions for a plurality of transistors, the first gate insulating layer GTI1 described above may be disposed on the active layer to overlap each of the plurality of channel regions. Also, the first gate insulating layer GTI1 may be patterned to have substantially the same shape as the first gate pattern GP1 and the second gate pattern GP2.

The first gate insulating layer GTI1 may include at least one of tetraethylorthosilicate (TEOS), silicon nitride (SiNx), or silicon oxide (SiO$_2$). For example, the first gate insulating layer GTI1 may have a double layer structure in which a silicon nitride layer having a thickness of 40 nm and a tetraethylorthosilicate layer having a thickness of 80 nm are sequentially stacked.

The first gate pattern GP1 and the second gate pattern GP2 may be disposed on the first gate insulating layer GTI1. In this case, the ninth upper gate electrode GE92 of the first gate pattern GP1 may be disposed on the first gate insulating layer GTI1 to overlap the ninth channel region CH9 of the active layer ACT. The tenth upper gate electrode GE102 of the second gate pattern GP2 may be disposed on the first gate insulating layer to overlap the tenth channel region CH10 of the active layer ACT. In this case, as shown in FIG. 9, the first gate pattern GP1 may be connected to the first light blocking layer BML1 through the first contact hole CT1 penetrating the first gate insulating layer GTI1 and the buffer layer BF.

A second gate insulating layer GTI2 may be disposed on the first gate pattern GP1 and the second gate pattern GP2. The second gate insulating layer GTI2 may be disposed on the entire surface of the substrate SUB including the first gate pattern GP1 and the second gate pattern GP2.

The second gate insulating layer GTI2 may include the same material and structure as the first gate insulating layer GTI1 described above.

An interlayer insulating layer ITL may be disposed on the second gate insulating layer GTI2. The interlayer insulating layer ITL may be disposed on the entire surface of the substrate SUB including the second gate insulating layer GTI2.

The interlayer insulating layer ITL may include an inorganic layer, for example, a silicon nitride layer, a silicon oxynitride layer, a silicon oxide layer, a titanium oxide layer, or an aluminum oxide layer. Meanwhile, the interlayer insulating layer ITL may include a plurality of inorganic layers.

As shown in FIG. 10, the second gate low voltage line GLL2 may be disposed on the interlayer insulating layer ITL. In this case, the second gate low voltage line GLL2 may be connected to the second light blocking layer BML2 through the second contact hole CT2 penetrating the interlayer insulating layer ITL, the second gate insulating layer GTI2 and the buffer layer BF.

A first planarization layer VA1 may be disposed on the second gate low voltage line GLL2. The first planarization layer VA1 may be disposed on the entire surface of the substrate SUB including the second gate low voltage line GLL2.

The first planarization layer VA1 may include an organic layer such as acryl resin, epoxy resin, phenolic resin, polyamide resin, polyimide resin and the like.

A second planarization layer VA2 may be disposed on the first planarization layer VA1. The second planarization layer VA2 may be disposed on the entire surface of the substrate SUB including the first planarization layer VA1.

The second planarization layer VA2 may include the same material and structure as the first planarization layer VA1 described above.

A bank PDL (or pixel definition layer) may be disposed on the second planarization layer VA2. The bank PDL serves to define the emission areas of the pixels. To this end, the bank may be disposed to expose a partial region of the pixel electrode (e.g., anode electrode) on the second planarization layer VA2. The bank PDL may cover the edge of the pixel electrode. The bank PDL may be formed of an organic layer such as acryl resin, epoxy resin, phenolic resin, polyamide resin, polyimide resin and the like.

A common electrode CM may be disposed on the bank PDL. Meanwhile, the light emitting element LEL may include the pixel electrode, the light emitting layer, and the common electrode CM. The emission area represents an area in which the pixel electrode, the light emitting layer, and the common electrode CM are sequentially stacked and holes from the pixel electrode and electrons from the common electrode CM are combined with each other in the light emitting layer to emit light. In this case, the pixel electrode may be the anode electrode of the light emitting element, and the common electrode CM may be the cathode electrode of the light emitting element LEL.

The light emitting layer may include an organic material to emit a predetermined color. For example, the light emitting layer may include a hole transporting layer, an organic material layer, and an electron transporting layer. The organic material layer may include a host and a dopant. The organic material layer may include a material that emits predetermined light, and may be formed using a phosphorescent material or a fluorescent material.

For example, the organic material layer of the first light emitting layer of the first emission area emitting the light of the first color may be a phosphorescent material including a host material including carbazole biphenyl (CBP) or mCP (1,3-bis(carbazol-9-yl), and a dopant including at least one selected from the group consisting of PIQIr(acac)(bis(1-phenylisoquinoline) acetylacetonate iridium), PQIr(acac) (bis(1-phenylquinoline) acetylacetonate iridium), PQIr(tris (1-phenylquinoline)iridium)) and PtOEP (octaethylporphyrin platinum). Alternatively, the organic material layer of the first light emitting layer of the first emission area may be a fluorescent material including PBD: Eu(DBM)3(Phen) or Perylene, but the present disclosure is not limited thereto.

The organic material layer of the second light emitting layer of the second emission area emitting the light of the second color may be a phosphorescent material including a host material including CBP or mCP, and a dopant material including Ir(ppy)3(fac tris(2-phenylpyridine)iridium. Alternatively, the organic material layer of the second light emitting layer of the second emission area emitting the light of the second color may be a fluorescent material including tris(8-hydroxyquinolino)aluminum (Alq3), but the present disclosure is not limited thereto.

The organic material layer of the light emitting layer of the third emission area emitting the light of the third color may be a phosphorescent material including a host material including CBP or mCP, and a dopant material including (4,6-F2ppy)2Irpic or L2BD111, but the present disclosure is not limited thereto.

The aforementioned common electrode CM may be disposed on the first, second, and third light emitting layers. The common electrode CM may be disposed to cover the first, second, and third light emitting layers. The common electrode CM may be a common layer commonly disposed in the first to third light emitting layers. A capping layer may be formed on the common electrode CM.

In the top emission structure, the common electrode CM may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the common electrode CM is formed of a semi-transmissive conductive material, the light emission efficiency can be increased due to a micro-cavity effect.

In a top emission structure that emits light toward the common electrode CM with respect to the light emitting layer, the pixel electrode may be formed of a single layer of molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO to increase the reflectivity. The APC alloy is an alloy of silver (Ag), palladium (Pd) and copper (Cu).

A spacer may be disposed on the bank PDL. The spacer may serve to support a mask during a process of manufacturing the light emitting layer EL. The spacer may be formed of an organic layer such as acryl resin, epoxy resin, phenolic resin, polyamide resin, polyimide resin and the like.

The encapsulation layer ENC may be formed on the light emitting element layer EMTL. The encapsulation layer ENC may include at least one inorganic layer TFE1 and TFE3 to prevent oxygen or moisture from permeating into the light emitting element layer EMTL. In addition, the encapsulation layer ENC may include at least one organic layer to protect the light emitting element layer EMTL from foreign substances such as dust. For example, the encapsulation layer ENC may include a first inorganic encapsulation layer TFE1, an organic encapsulation layer TFE2, and a second inorganic encapsulation layer TFE3.

The first inorganic encapsulation layer TFE1 may be disposed on the common electrode CM, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be formed of a multilayer in which one or more inorganic layers of a silicon nitride layer, a silicon oxynitride layer, a silicon oxide layer, a titanium oxide layer and an aluminum oxide layer are stacked. The encapsulation organic layer TFE2 may be an organic layer such as acryl resin, epoxy resin, phenolic resin, polyamide resin, polyimide resin or the like.

Figure 11:
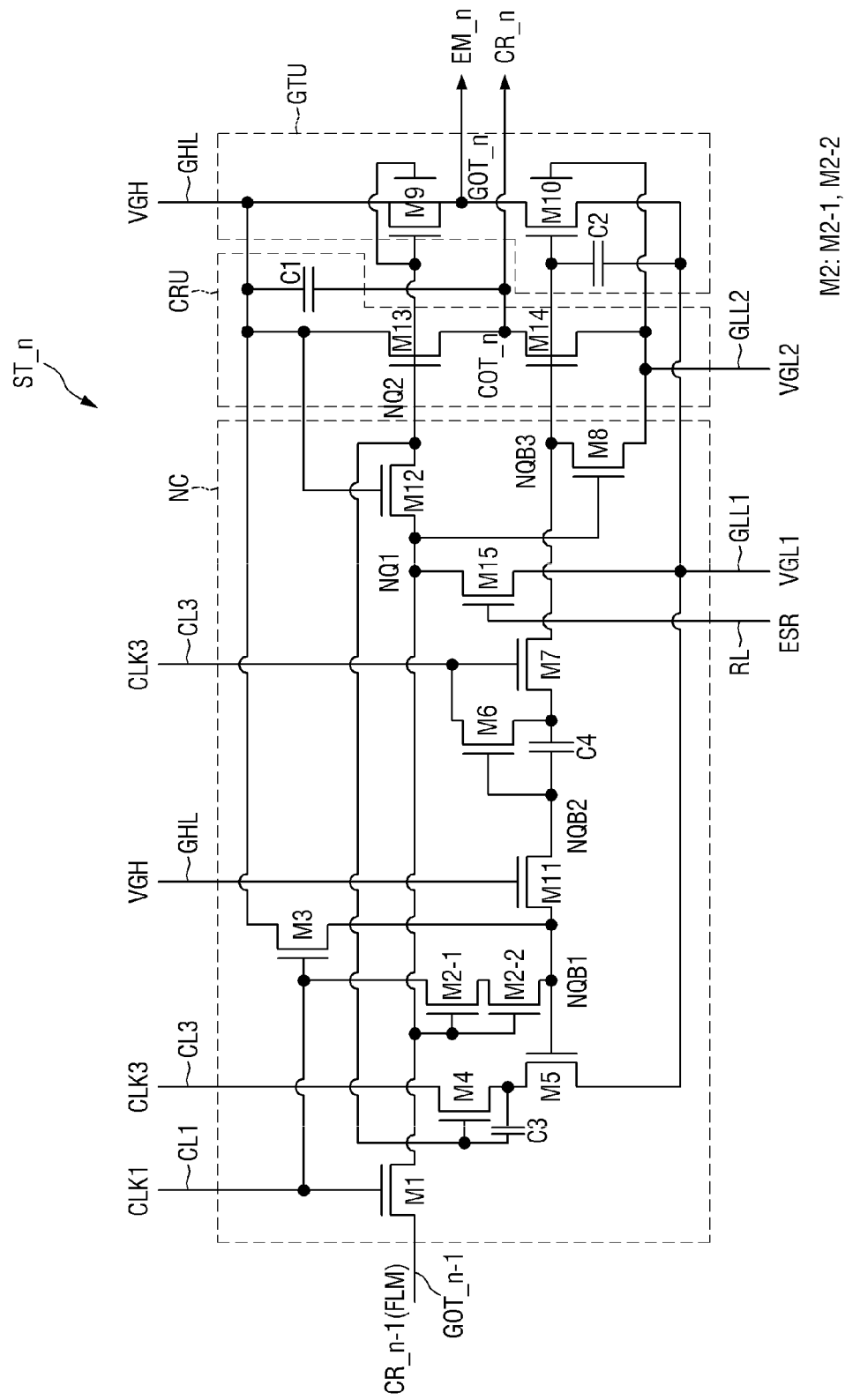
FIG. 11 is a detailed configuration diagram of one stage included in the emission control driver of FIG. 3.

FIG. 11 is a detailed configuration diagram of one stage (e.g., $n^{th}$ stage ST_n) included in the emission control driver of FIG. 3.

As shown in FIG. 11, the $n^{th}$ stage ST_n may include a node control unit NC, a carry output unit CRU, and a gate output unit GTU.

The $n^{th}$ stage ST_n may include first to fifteenth transistors M1 to M15, a first capacitor C1, a second capacitor C2, and a third capacitor C3. For example, the node control unit NC may include the first to eighth transistors M1 to M8, an eleventh transistor M11, a twelfth transistor M12, and a fifteenth transistor M15. The carry output unit CRU may include a thirteenth transistor M13 and a fourteenth transistor M14. The gate output unit GTU may include the ninth transistor M9 and the tenth transistor M10. In this case, the ninth transistor M9 and the tenth transistor M10 may be output transistors that output an $n^{th}$ emission signal. For example, the ninth transistor M9 may be a pull-up transistor and the tenth transistor M10 may be a pull-down transistor.

A gate electrode of the first transistor M1 may be connected to the first clock line CL1, a drain electrode of the first transistor M1 may be connected to the carry output terminal COT_n−1 of the $(n-1)^{th}$ stage, and a source electrode of the first transistor M1 may be connected to a first set node NQ1.

A gate electrode of the second transistor M2 may be connected to the first set node NQ1, a drain electrode of the second transistor M2 may be connected to the first clock line CL1, and a source electrode of the second transistor M2 may be connected to a first reset node NQB1. Meanwhile, the second transistor M2 may include a second-first sub-transistor M2-1 and a second-second sub-transistor M2-2 connected in series between the first clock line CL1 and the first reset node NQB1.

The gate electrode of the third transistor M3 may be connected to the first clock line CL1, the drain electrode of the third transistor M3 may be connected to the gate high voltage line GHL, and the source electrode of the third transistor M3 may be connected to the first reset node NQB1.

The gate electrode of the fourth transistor M4 may be connected to a second set node NQ2, the drain electrode of the fourth transistor M4 may be connected to a third clock line CL3, and the source electrode of the fourth transistor M4 may be connected to the drain electrode of the fifth transistor M5.

The gate electrode of the fifth transistor M5 may be connected to the first reset node NQB1, the drain electrode of the fifth transistor M5 may be connected to the source electrode of the fourth transistor M4, and the source electrode of the fifth transistor M5 may be connected to the first gate low voltage line GLL1.

The gate electrode of the sixth transistor M6 may be connected to a second reset node NQB2, the drain electrode of the sixth transistor M6 may be connected to the third clock line CL3, and the source electrode of the sixth transistor M6 may be connected to the drain electrode of the seventh transistor M7.

The gate electrode of the seventh transistor M7 may be connected to the third clock line CL3, the drain electrode of the seventh transistor M7 may be connected to the source electrode of the sixth transistor M6, and the source electrode of the seventh transistor M7 may be connected to a third reset node NQB3.

The gate electrode of the eighth transistor M8 may be connected to the first set node NQ1, the drain electrode of the eighth transistor M8 may be connected to the third reset node NQB3, and the source electrode of the eighth transistor M8 may be connected to the second gate low voltage line GLL2.

The gate electrode of the ninth transistor M9 may be connected to the second set node NQ2, the drain electrode of the ninth transistor M9 may be connected to the gate high voltage line GHL, and the source electrode of the ninth transistor M9 may be connected to the gate output terminal GOT_n. Meanwhile, the gate electrode of the ninth transistor M9 may include a lower gate electrode (or a counter gate electrode) and an upper gate electrode. In other words, the ninth transistor M9 may include a lower gate electrode and an upper gate electrode connected to each other.

The gate electrode of the tenth transistor M10 may be connected to the third reset node NQB3, the drain electrode of the tenth transistor M10 may be connected to the carry output terminal COT_n, and the source electrode of the tenth transistor M10 may be connected to the first gate low voltage line GLL1. Meanwhile, the gate electrode of the tenth transistor M10 may include a lower gate electrode (or a counter gate electrode) and an upper gate electrode. The upper gate electrode of the tenth transistor M10 may be connected to the third reset node NQB3, and the lower gate electrode of the tenth transistor M10 may be connected to the second gate low voltage line GLL2. Meanwhile, a width of a channel region of the ninth transistor M9 described above may be greater than that of a channel region of the tenth transistor M10.

A gate electrode of the eleventh transistor M11 may be connected to the gate high voltage line GHL, a drain electrode of the eleventh transistor M11 may be connected to the first reset node NQB1, and a source electrode of the eleventh transistor M11 may be connected to the second reset node NQB2.

A gate electrode of the twelfth transistor M12 may be connected to the gate high voltage line GHL, a drain electrode of the twelfth transistor M12 may be connected to the first set node NQ1, and a source electrode of the twelfth transistor M12 may be connected to the second set node NQ2.

A gate electrode of the thirteenth transistor M13 may be connected to the second set node NQ2, a drain electrode of the thirteenth transistor M13 may be connected to the gate high voltage line GHL, and a source electrode of the thirteenth transistor M13 may be connected to the carry output terminal COT_n.

A gate electrode of the fourteenth transistor M14 may be connected to the third reset node NQB3, a drain electrode of the fourteenth transistor M14 may be connected to the carry output terminal COT_n, and a source electrode of the fourteenth transistor M14 may be connected to the second gate low voltage line GLL2.

A gate electrode of the fifteenth transistor M15 may be connected to a reset signal line RL, a drain electrode of the fifteenth transistor M15 may be connected to the first set node NQ1, and a source electrode of the fifteenth transistor M15 may be connected to the first gate low voltage line GLL1. Here, the reset signal line RL may transmit a reset signal ESR. The reset signal ESR may have, for example, the same level as the gate high voltage VGH. In another embodiment, the reset signal ESR may be the $(n+2)^{th}$ carry signal from the subsequent stage (e.g., $(n+2)^{th}$ stage). The reset signal ESR may be simultaneously applied to the gate electrodes of the fifteenth transistors M15 provided in all stages of the emission control driver, for example.

The first electrode of the first capacitor C1 may be connected to the gate high voltage line GHL, and the second electrode of the first capacitor C1 may be connected to the carry output terminal COT_n.

The first electrode of the second capacitor C2 may be connected to the third reset node NQB3, and the second electrode of the second capacitor C2 may be connected to the first gate low voltage line GLL1.

The first electrode of the third capacitor C3 may be connected to the second set node NQ2, and the second electrode of the third capacitor C3 may be connected to the source electrode of the fourth transistor M4.

The first electrode of the fourth capacitor C4 may be connected to the second reset node NQB2, and the second electrode of the fourth capacitor C4 may be connected to the source electrode of the sixth transistor M6.

Figure 12:
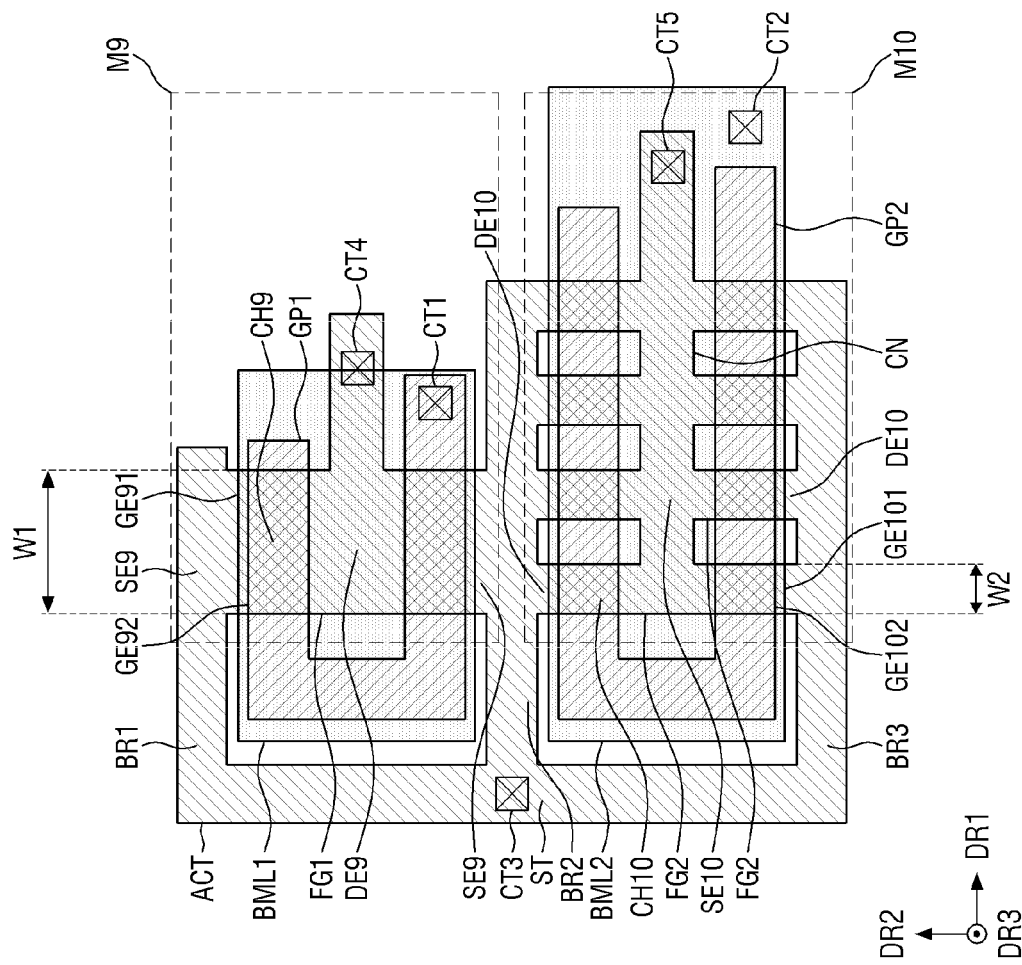
FIG. 12 is a plan view showing a layout of the ninth transistor and the tenth transistor of FIG. 11.
Figure 13:
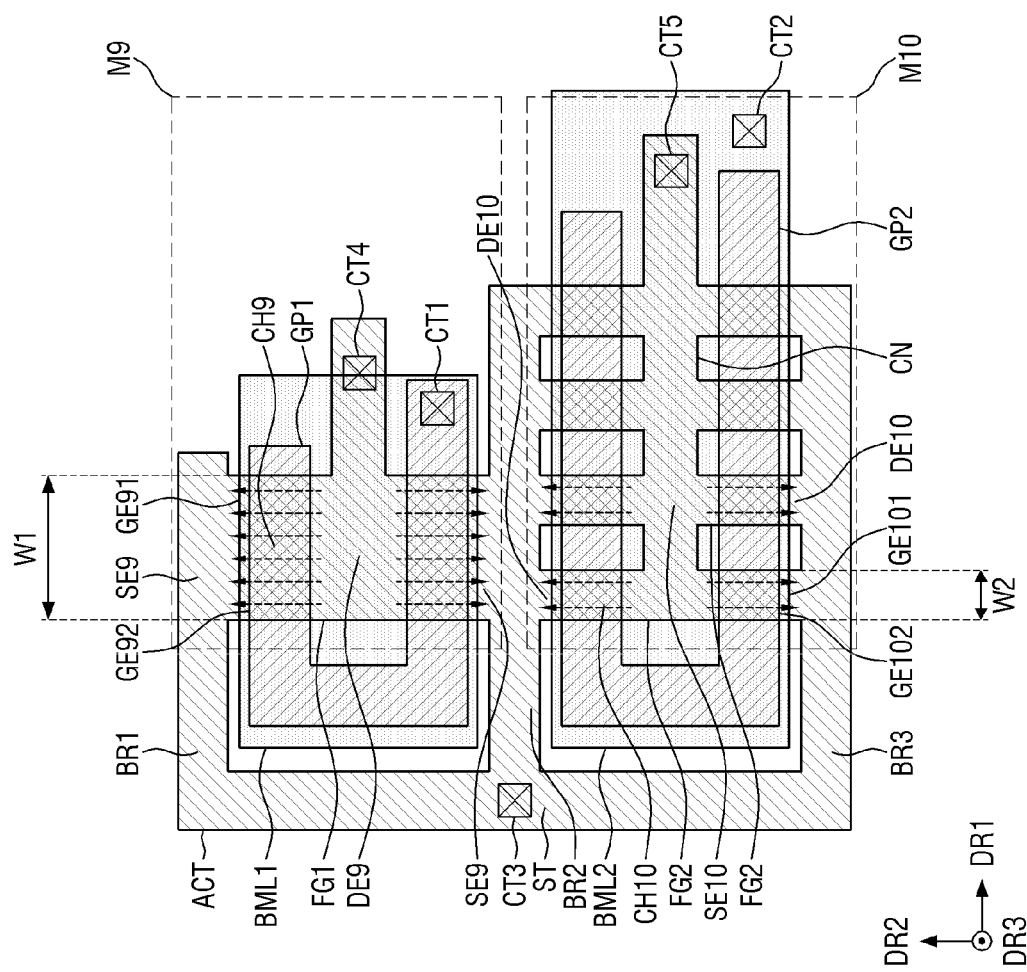
FIG. 13 is a view for describing the current driving capability of the ninth transistor and the tenth transistor of FIG. 11.

FIG. 12 is a plan view showing a layout of the ninth transistor M9 and the tenth transistor M10 of FIG. 11, and FIG. 13 is a view for describing the current driving capability of the ninth transistor M9 and the tenth transistor M10 of FIG. 11.

The ninth transistor M9 may include a channel region (hereinafter, the ninth channel region CH9), a lower gate electrode (hereinafter, the ninth lower gate electrode GE91), an upper gate electrode (hereinafter, the ninth upper gate electrode GE92), a drain electrode (hereinafter, the ninth drain electrode DE9), and a source electrode (hereinafter, the ninth source electrode SE9). The ninth channel region CH9 may be disposed in an overlapping region between the active layer ACT and a ninth gate electrode (e.g., at least one of the ninth upper gate electrode GE92 or the ninth lower gate electrode GE91). For example, a region of the active layer ACT overlapping the ninth upper gate electrode GE92 may be the aforementioned ninth channel region CH9. Further, regions of the active layer ACT disposed on both sides of the ninth channel region CH9 may be the ninth drain electrode DE9 and the ninth source electrode SE9, respectively.

The tenth transistor M10 may include a channel region (hereinafter, the tenth channel region CH10), a lower gate electrode (hereinafter, the tenth lower gate electrode GE101), an upper gate electrode (hereinafter, the tenth upper gate electrode GE102), a drain electrode (hereinafter, the tenth drain electrode DE10), and a source electrode (hereinafter, the tenth source electrode SE10). The tenth channel region CH10 may be disposed in an overlapping region between the active layer ACT and a tenth gate electrode (e.g., at least one of the tenth upper gate electrode GE102 or the tenth lower gate electrode GE101). For example, a region of the active layer ACT overlapping the tenth upper gate electrode GE102 may be the aforementioned tenth channel region CH10. Further, regions of the active layer ACT disposed on both sides of the tenth channel region CH10 may be the tenth drain electrode DE10 and the tenth source electrode SE10, respectively.

The ninth channel region CH9 of the ninth transistor M9 corresponding to a pull-up transistor may have a greater width than the tenth channel region CH10 of the tenth transistor M10 corresponding to a pull-down transistor (width W1>width W2). In other words, the width W1 of the ninth channel region CH9 may be greater than the width W2 of the tenth channel region CH10. For example, the width W1 of the channel region of the ninth transistor M9 may be greater than or equal to 7 μm and less than or equal to 12 μm. The width W2 of the channel region of the tenth transistor M10 may be greater than or equal to 3 μm and less than or equal to 7 μm. Accordingly, the ninth transistor M9 that is a pull-up transistor may have a greater current driving capability than the tenth transistor M10 that is a pull-down transistor. In other words, as illustrated in FIG. 8, an amount of current flowing through the turned-on ninth transistor M9 may be greater than an amount of current flowing through the turned-on tenth transistor M10. Dotted arrows in FIG. 13 indicate the flow of current flowing from the ninth drain electrode DE9 of the ninth transistor M9 to the ninth source electrode SE9 thereof and the flow of current flowing from the tenth source electrode SE10 of the tenth transistor M10 to the tenth drain electrode DE10 thereof. As shown in the same drawing, the amount of current flowing through the ninth transistor M9 is greater than the amount of current flowing through the tenth transistor M10.

The width W1 of the ninth channel region CH9 described above may be a size of the facing surfaces of the ninth drain electrode DE9 and the ninth source electrode SE9 that are disposed with the ninth channel region CH9 interposed therebetween. For example, the width W1 of the ninth channel region CH9 may be a size of the ninth channel region CH9 in the first direction DR1. Similarly, the width W2 of the tenth channel region CH10 described above may be a size of the facing surfaces of the tenth drain electrode DE10 and the tenth source electrode SE10 that are disposed with the tenth channel region CH10 interposed therebetween. For example, the width W2 of the tenth channel region CH10 may be a size of the tenth channel region CH10 in the first direction DR1. Meanwhile, a length of the ninth channel region CH9 may be a distance between the ninth drain electrode DE9 and the ninth source electrode SE9 that are disposed with the ninth channel region CH9 interposed therebetween. The length of the ninth channel region CH9 may be a size of the ninth channel region CH9 in the second direction DR2. Similarly, a length of the tenth channel region CH10 may be a distance between the tenth drain electrode DE10 and the tenth source electrode SE10 that are disposed with the tenth channel region CH10 interposed therebetween. For example, the length of the tenth channel region CH10 may be a size of the tenth channel region CH10 in the second direction DR2.

The aforementioned ninth lower gate electrode GE91 may be included in the first light blocking layer BML1. In other words, the ninth lower gate electrode GE91 may be a part of the first light blocking layer BML1. The first light blocking layer BML1 may overlap the ninth channel region CH9 and the ninth upper gate electrode GE92.

The first upper gate pattern GP1 including the first gate electrode GE1 may have a U shape opened in the first direction DR1. The ninth upper gate electrode GE92 may be connected to the first light blocking layer BML1 through the first contact hole CT1 penetrating the insulating layer.

The aforementioned tenth lower gate electrode GE101 may be included in the second light blocking layer BML2. In other words, the tenth lower gate electrode GE101 may be a part of the second light blocking layer BML2. The second light blocking layer BML2 may overlap the tenth channel region CH10 and the tenth upper gate electrode GE102.

The second gate pattern GP2 including the tenth upper gate electrode GE102 may have a U shape opened in the first direction DR1.

The active layer ACT may be an oxide semiconductor. For example, the active layer ACT may be an oxide semiconductor including indium-gallium-zinc oxide (IGZO) or an oxide semiconductor including indium-gallium-zinc-tin oxide (IGZTO). Meanwhile, when the active layer ACT is an oxide semiconductor, a first gate signal, which is generated by the N-type ninth transistor M9 and tenth transistor M10 including the active layer ACT, may generally have a large deviation in the rising time and the falling time. For example, the rising time of the emission signal, which is affected by the current driving capability of the ninth transistor M9 that is a pull-up transistor, may be greater than the falling time of the emission signal, which is affected by the current driving capability of the tenth transistor M10 that is a pull-down transistor. Accordingly, the output waveform of the emission signal may be distorted. However, according to the present disclosure, since the channel region (e.g., the ninth channel region CH9) of the pull-up transistor (e.g., the ninth transistor M9) has a larger width than the channel region (e.g., the tenth channel region CH10) of the pull-down transistor (e.g., the tenth transistor M10), the current driving capability of the ninth transistor M9 may be more improved than the current driving capability of the tenth transistor M10. In other words, an amount of current flowing through the turned-on ninth transistor M9 may be greater than an amount of current flowing through the turned-on tenth transistor M10. Accordingly, the deviation between the falling time and the rising time of the first gate signal is minimized, so that the output of the emission signal may be stabilized. Also, since the channel width of the pull-down transistor (e.g., the tenth transistor M10) may be decreased, the size of the pull-down transistor may be decreased. Accordingly, the output of the emission control driver may be stabilized and the size of the emission control driver may be decreased. When the size of the emission control driver is decreased, the area of the non-display area (e.g., a dead space) where the emission control driver is disposed may be decreased.

The active layer ACT may be connected to the gate output terminal GOT_n disposed thereabove through the third contact hole CT3 extending through an insulating layer. Also, the active layer ACT may be connected to a drain connection terminal disposed thereabove through the fourth contact hole CT4 extending through the insulating layer. Also, the active layer ACT may be connected to a source connection terminal disposed thereabove through the fifth contact hole CT5 extending through the insulating layer.

As shown in FIG. 12, the active layer ACT may include a stem portion ST, a first branch portion BR1, a second branch portion BR2, a third branch portion BR3, a first connection portion CN1, a second connection portion CN2, at least one first finger portion FG1, and at least one second finger portion FG2.

The stem portion ST may extend along the second direction DR2.

The first branch portion BR1 may extend from the upper edge of the stem portion ST along the first direction DR1.

The second branch portion BR2 may be disposed between the first branch portion BR1 and the third branch portion BR3. The second branch portion BR2 may extend from the center of the stem portion ST along the first direction DR1.

The third branch portion BR3 may extend from the lower edge of the stem portion ST along the first direction DR1.

The first finger portion FG1 may be disposed between the first branch portion BR1 and the second branch portion BR2. The first finger portion FG1 may extend along the second direction DR2. One side of the first finger portion FG1 may be connected to the first branch portion BR1, and the other side of the first finger portion FG1 may be connected to the second branch portion BR2. The first finger portion FG1 may overlap the first gate pattern GP1. The ninth channel region CH9 of the ninth transistor M9 described above may be defined by an overlapping region between, for example, the first finger portion FG1 and the first gate pattern GP1 (or the ninth upper gate electrode GE92 of the first gate pattern GP1). The first finger portion FG1 may be provided in plural number. For example, the plurality of first finger portions FG1 may be disposed between the first branch portion BR1 and the second branch portion BR2 while being spaced apart from each other. The first finger portion FG1 may overlap the first gate pattern GP1. The aforementioned ninth channel region CH9 may be disposed in a part of the first finger portion FG1, which overlaps the first gate pattern GP1. A part of the first finger portion FG1, which is disposed in a curved portion of the first gate pattern GP1, may include the ninth drain electrode DE9 of the ninth transistor M9. Parts of the first finger portion FG1, which are respectively disposed above and below the first gate pattern GP1, may include the source electrode of the ninth transistor M9.

The second finger portion FG2 may be disposed between the second branch portion BR2 and the third branch portion BR3. The second finger portion FG2 may extend along the second direction DR2. One side of the second finger portion FG2 may be connected to the second branch portion BR2, and the other side of the second finger portion FG2 may be connected to the third branch portion BR3. The second finger portion FG2 may overlap the second gate pattern GP2. The tenth channel region CH10 of the tenth transistor M10 described above may be defined by an overlapping region between, for example, the second finger portion FG2 and the second gate pattern GP2 (or the tenth upper gate electrode GE102 of the second gate pattern GP2). The second finger portion FG2 may be provided in plural number. For example, as shown in FIG. 12, four second finger portions FG2 may be disposed between the second branch portion BR2 and the third branch portion BR3 while being separated from each other. Meanwhile, three or less second finger portions FG2 or five or more second finger portions FG2 may be disposed between the second branch portion BR2 and the third branch portion BR3. The second finger portion FG2 may overlap the second gate pattern GP2. The aforementioned second channel region CH2 and tenth channel region CH10 may be disposed in a part of the second finger portion FG2, which overlaps the second gate pattern GP2. A part of the second finger portion FG2, which is disposed in a curved portion of the second gate pattern GP2, may include the tenth source electrode SE10 of the tenth transistor M10. Parts of the second finger portion FG2, which are respectively disposed above and below the second gate pattern GP2, may include the tenth drain electrode DE10 of the tenth transistor M10.

The connection portion may be disposed between the adjacent second finger portions FG2. The connection portion may extend along the first direction DR1.

The number of the first finger portions FG1 and the number of the second finger portions FG2 may be the same or different. For example, the number of the second finger portions FG2 may be greater than the number of the first finger portions FG1.

The first finger portion FG1 may include the ninth channel region CH9, and the second finger portion FG2 may include the tenth channel region CH10. A width of the first finger portion FG1 in the first direction DR1 may be greater than a width of the second finger portion FG2 in the first direction DR1.

A length of the first finger portion FG1 in the second direction DR2 may be the same as or different from a size of the second finger portion FG2 in the second direction DR2. For example, the length of the first finger portion FG1 in the second direction DR2 may be greater than the length of the second finger portion FG2 in the second direction DR2.

An area of the first finger portion FG1 may be greater than that of the second finger portion FG2. Meanwhile, when each of the first finger portion FG1 and the second finger portion FG2 is provided in plural number, the total area of the plurality of first finger portions FG1 may be greater than the total area of the plurality of second finger portions FG2.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a substrate having a display area and a non-display area;
a pixel disposed in the display area of the substrate; and
a gate driving circuit disposed in the non-display area of the substrate and connected to a transistor of the pixel,
wherein the gate driving circuit comprises a plurality of stages,
wherein each of the plurality of stages in the gate driving circuit includes:
a node control unit;
a carry output unit connected to the node control unit and outputting a carry signal applied to at least one of a previous stage or a subsequent stage;
a pull-up transistor connected to a set node of the node control unit through a first gate electrode; and
a pull-down transistor connected to a reset node of the node control unit through a second gate electrode,
wherein a width of a first channel region of the pull-up transistor is greater than a width of a second channel region of the pull-down transistor,
wherein the carry output unit includes a first transistor connected to the set node through a gate electrode and a second transistor connected to the reset node through a gate electrode, and
wherein the pull-up transistor further includes a first counter gate electrode connected to the first gate electrode, and the pull-down transistor further includes a second counter gate electrode connected to a different node than the second gate electrode.

2. The display device of claim 1, further comprising an active layer comprising the first channel region and the second channel region.

3. A display device comprising:
a substrate having a display area and a non-display area;
a pixel disposed in the display area of the substrate;
a gate driving circuit disposed in the non-display area of the substrate and connected to a transistor of the pixel; and
an active layer including a first channel region and a second channel region,
wherein the gate driving circuit comprises:
a node control unit;
a pull-up transistor connected to a set node of the node control unit through a gate electrode; and
a pull-down transistor connected to a reset node of the node control unit through a gate electrode,
wherein a width of the first channel region of the pull-up transistor is greater than a width of the second channel region of the pull-down transistor, and
wherein the active layer comprises:
a stem portion;
a first branch portion extending from an upper edge of the stem portion along a first direction;
a second branch portion extending from a center of the stem portion along the first direction;
a third branch portion extending from a lower edge of the stem portion along the first direction;
a first finger portion extending between the first branch portion and the second branch portion and comprising the first channel region; and
a second finger portion extending between the second branch portion and the third branch portion and comprising the second channel region.

4. The display device of claim 3, wherein more than one of the first finger portion are provided between the first branch portion and the second branch portion.

5. The display device of claim 4, further comprising a first connection portion extending between the first finger portions adjacent to each other.

6. The display device of claim 3, wherein more than one of the second finger portion are provided between the second branch portion and the third branch portion.

7. The display device of claim 6, further comprising a second connection portion extending between the second finger portions adjacent to each other.

8. The display device of claim 3, further comprising a first gate pattern overlapping the first finger portion.

9. The display device of claim 8, wherein the first gate pattern comprises the first gate electrode of the pull-up transistor.

10. The display device of claim 9, wherein the first channel region is defined by an overlapping of the first gate electrode and the first finger portion.

11. The display device of claim 10, further comprising a first light blocking layer disposed to overlap the first finger portion and the first gate electrode.

12. The display device of claim 11, wherein the first light blocking layer further comprises the first counter gate electrode overlapping the first gate electrode.

13. The display device of claim 12, wherein the first gate electrode and the first counter gate electrode are connected through a contact hole in an insulating layer.

14. The display device of claim 3, further comprising a second gate pattern overlapping the second finger portion.

15. The display device of claim 14, wherein the second gate pattern comprises the second gate electrode of the pull-down transistor.

16. The display device of claim 15, wherein the second channel region is defined by an overlapping of the second gate electrode and the second finger portion.

17. The display device of claim 16, further comprising a second light blocking layer overlapping the second finger portion and the second gate electrode.

18. The display device of claim 17,
wherein the second light blocking layer further comprises a second counter gate electrode overlapping the second gate electrode, and
wherein the second counter gate electrode is connected to a gate low voltage line through a contact hole in an insulating layer.

19. The display device of claim 3, wherein the number of the second finger portions is greater than the number of the first finger portions.

20. An electronic device comprising:
a display device;
wherein the display device comprises:
a substrate having a display area and a non-display area;
a pixel disposed in the display area of the substrate; and
a gate driving circuit disposed in the non-display area of the substrate and connected to a transistor of the pixel,
wherein the gate driving circuit comprises a plurality of stages,
wherein each of the plurality of stages in the gate driving circuit includes:
a node control unit;

a carry output unit connected to the node control unit and outputting a carry signal applied to at least one of a previous stage or a subsequent stage;

a pull-up transistor connected to a set node of the node control unit through a first gate electrode; and a pull-down transistor connected to a reset node of the node control unit through a second gate electrode, wherein a width of a first channel region of the pull-up transistor is greater than a width of a second channel region of the pull-down transistor, wherein the carry output unit includes a first transistor connected to the set node through a gate electrode and a second transistor connected to the reset node through a gate electrode, and wherein the pull-up transistor further includes a first counter gate electrode connected to the first gate electrode, and the pull-down transistor further includes a second counter gate electrode connected to a different node than the second gate electrode.

* * * * *